United States Patent
Feng

(10) Patent No.: US 11,081,199 B2
(45) Date of Patent: Aug. 3, 2021

(54) SHIFT REGISTER AND METHOD OF DRIVING THE SAME, GATE DRIVING CIRCUIT, DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Xuehuan Feng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/452,096

(22) Filed: Jun. 25, 2019

(65) Prior Publication Data

US 2020/0027516 A1    Jan. 23, 2020

(30) Foreign Application Priority Data

Jul. 18, 2018    (CN) .......................... 201810792882.8

(51) Int. Cl.

| | |
|---|---|
| G11C 19/00 | (2006.01) |
| G11C 19/28 | (2006.01) |
| G09G 3/3233 | (2016.01) |
| G09G 3/3266 | (2016.01) |
| G09G 3/3291 | (2016.01) |
| G09G 3/36 | (2006.01) |
| G09G 3/20 | (2006.01) |

(52) U.S. Cl.
CPC ............. *G11C 19/287* (2013.01); *G09G 3/20* (2013.01); *G09G 3/3233* (2013.01); *G09G 3/3266* (2013.01); *G09G 3/3291* (2013.01); *G09G 3/3677* (2013.01); *G11C 19/28* (2013.01); *G09G 2300/043* (2013.01); *G09G 2300/0426* (2013.01); *G09G 2300/0809* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2018/0075923 A1* | 3/2018 | Ma | G09G 3/3266 |
| 2018/0226008 A1* | 8/2018 | Zhou | G11C 19/28 |
| 2018/0233210 A1* | 8/2018 | Han | G11C 19/287 |
| 2018/0301100 A1* | 10/2018 | Li | G09G 3/3674 |
| 2018/0337682 A1* | 11/2018 | Takasugi | G09G 3/3241 |

(Continued)

*Primary Examiner* — Tuan T Lam
(74) *Attorney, Agent, or Firm* — Nath, Goldberg & Meyer; Joshua B. Goldberg

(57) ABSTRACT

The present application provides a shift register and a method of driving the same, and a gate driving circuit. The shift register includes a detection sub-shift register. The detection sub-shift register includes: a detection input sub-circuit configured to provide a signal of the first input terminal to the pull-up control node under the control of the first clock signal terminal, and provide a signal of the second clock signal terminal to the first pull-up node under the control of the pull-up control node; and a detection output sub-circuit configured to provide a signal of the third clock signal terminal to the first output terminal under the control of the first pull-up node.

20 Claims, 16 Drawing Sheets

(56) References Cited

U.S. PATENT DOCUMENTS

| | | | |
|---|---|---|---|
| 2019/0206352 A1* | 7/2019 | Wang | G11C 19/184 |
| 2020/0020266 A1* | 1/2020 | Feng | G09G 3/20 |
| 2020/0044092 A1* | 2/2020 | Feng | H01L 29/7869 |
| 2020/0051507 A1* | 2/2020 | Feng | G11C 19/28 |
| 2020/0051656 A1* | 2/2020 | Feng | G11C 19/287 |
| 2020/0126467 A1* | 4/2020 | Feng | G11C 19/28 |
| 2020/0135286 A1* | 4/2020 | Li | G11C 19/28 |

* cited by examiner

SHIFT REGISTER AND METHOD OF DRIVING THE SAME, GATE DRIVING CIRCUIT, DISPLAY DEVICE

CROSS-REFERENCE TO RELATED APPLICATION

This application claims priority to Chinese Patent Application No. 201810792882.8, filed on Jul. 18, 2018, the contents of which are incorporated herein by reference in the entirety.

TECHNICAL FIELD

The present application relates to the field of display technology, and specifically to a shift register and a method of driving the same, a gate driving circuit, and a display device.

BACKGROUND

With the development of display technology, display panels with high resolution and narrow bezel have become a trend of development. For this reason, the gate driver on array (GOA) technology has appeared. During display, the gate driving circuit outputs a gate scan signal and pixels are scanned progressively. A GOA circuit typically includes a plurality of cascaded shift registers, and each shift register sequentially passes the scan signal to the next shift register, so that the GOA circuit drives thin film transistor switches to turn on row by row to complete the data signal input of the pixel unit.

In the field of display, especially the organic light-emitting diode (OLED) display, the difference in threshold voltages of the driving transistors in respective pixel circuits may cause display defects, and therefore, in the OLED display, each pixel circuit typically includes a portion for display and a portion for detecting and/or compensating the threshold voltage of the driving transistor. Accordingly, each shift register of the GOA circuit includes, in addition to the display part for driving display, a detection part for driving detection and/or compensation of the threshold voltage of the driving transistor. When the input of the detection part of the current stage of shift register of the GOA circuit is affected by the load of the detection part of the previous stage of shift register, not only the cascading capability of the entire GOA circuit is weakened, but also the stability of display and display effect are affected.

SUMMARY

Embodiments of the present disclosure provide a shift register and a method of driving the same, a gate driving circuit, and a display device.

In a first aspect, the embodiments of the present disclosure provide a shift register, which includes a display sub-shift register and a detection sub-shift register coupled to the display sub-shift register. The sub-detection shift register includes: a first input terminal, a first output terminal, a first reset terminal, and a second reset terminal; a detection input sub-circuit, which is coupled to a first clock signal terminal, a second clock signal terminal, the first input terminal, a pull-up control node and a first pull-up node of the detection sub-shift register, and configured to provide a signal of the first input terminal to the pull-up control node under the control of the first clock signal terminal, and provide a signal of the second clock signal terminal to the first pull-up node under the control of the pull-up control node; a detection output sub-circuit, which is coupled to the first pull-up node, a third clock signal terminal and the first output terminal, and configured to provide a signal of the third clock signal terminal to the first output terminal under the control of the first pull-up node; a detection output control sub-circuit, which is coupled to the first output terminal, a first pull-down node and a low-level voltage terminal, and configured to provide a signal of the low-level voltage terminal to the first output terminal under the control of the first pull-down node; a detection reset sub-circuit, which is coupled to the first reset terminal, the second reset terminal, the first pull-up node, the pull-up control node and the low-level voltage terminal, and configured to provide a constant low level signal of the low-level voltage terminal to the first pull-up node under the control of the first reset terminal, and provide the signal of the low-level voltage terminal to the pull-up control node under the control of the second reset terminal; and a detection node control sub-circuit, which is coupled to a first control terminal, a second control terminal, the first pull-up node, the first pull-down node, and the low-level voltage terminal, and configured to provide the signal of the low-level voltage terminal to the first pull-down node under the control of the first control terminal, the second control terminal, and the first pull-up node.

In some embodiments, a time period in which a signal of the first pull-up node is at an on level at least partially overlaps with a time period in which a signal of the first output terminal is at an on level, and when the signal of the first pull-up node is at an off level, the signal of the first output terminal is at an off level.

In some embodiments, the detection sub-shift register further includes a first control sub-circuit, which is coupled to a display control terminal, the first pull-down node, and the low-level voltage terminal, and configured to provide the signal of the low-level voltage terminal to the first pull-down node under the control of the display control terminal.

In some embodiments, a voltage level of an off signal provided to the first reset terminal, the second reset terminal, and the first clock signal terminal is lower than a voltage level of the signal of the low-level voltage terminal.

In some embodiments, the detection output sub-circuit is further coupled to a fourth clock signal terminal and a second output terminal, and is configured to provide a signal of the fourth clock signal terminal to the second output terminal under the control of the first pull-up node. The detection output control sub-circuit is further coupled to the second output terminal, and is configured to provide the signal of the low-level voltage terminal to the second output terminal under the control of the first pull-down node.

In some embodiments, the detection input sub-circuit includes: a first transistor and a third transistor. The first transistor has a control electrode coupled to the first clock signal terminal, a first electrode coupled to the first input terminal, and a second electrode coupled to the pull-up control node. The third transistor has a control electrode coupled to the pull-up control node, a first electrode coupled to the second clock signal terminal, and a second electrode coupled to the first pull-up node.

In some embodiments, the detection input sub-circuit includes: a first transistor, a third transistor, and a twelfth transistor. The first transistor has a control electrode coupled to the first clock signal terminal, a first electrode coupled to the first input terminal, and a second electrode coupled to a first electrode of the twelfth transistor. The twelfth transistor has a control electrode coupled to the first clock signal terminal, and a second electrode coupled to the pull-up control node. The third transistor has a control electrode coupled to the pull-up control node, a first electrode coupled to the second clock signal terminal, and a second electrode coupled to the first pull-up node.

In some embodiments, the detection reset sub-circuit includes: a first reset sub-circuit and a second reset sub-circuit. The first reset sub-circuit is coupled to the first pull-up node, the low-level voltage terminal, and the first reset terminal, and configured to provide the signal of the low-level voltage terminal to the first pull-up node under the control of the first reset terminal. The second reset sub-circuit is coupled to the second reset terminal, the pull-up control node and the low-level voltage terminal, and configured to provide the signal of the low-level voltage terminal to the pull-up control node under the control of the second reset terminal.

In some embodiments, the first reset sub-circuit includes: a fourth transistor. The fourth transistor has a control electrode coupled to the first reset terminal, a first electrode coupled to the first pull-up node, and a second electrode coupled to the low-level voltage terminal.

In some embodiments, the first reset sub-circuit includes: a fourth transistor and a fifteenth transistor. The fourth transistor has a control electrode coupled to the first reset terminal, a first electrode coupled to the first pull-up node, and a second electrode coupled to a first feedback node. The fifteenth transistor has a control electrode coupled to the first reset terminal, a first electrode coupled to the first feedback node, and a second electrode coupled to the low-level voltage terminal. The detection sub-shift register further includes: a first leakage prevention sub-circuit. The first leakage prevention sub-circuit is coupled to the first pull-up node, the first pull-down node, the first feedback node, a high-level voltage terminal, and the low-level voltage terminal, and configured to, under the control of the first pull-down node and the first pull-up node, provide the signal of the low-level voltage terminal to the first feedback node in response to the first pull-down node being at an on level, and provide a signal of the high-level voltage terminal to the first feedback node in response to the first pull-up node being at an on level and the first pull-down node being at an off level, to maintain the on level of the first pull-up node. The first leakage prevention sub-circuit includes: a sixteenth transistor, a seventeenth transistor, and an eighteenth transistor. The sixteenth transistor has a control electrode coupled to the first pull-down node, a first electrode coupled to the first pull-up node, and a second electrode coupled to a first electrode of the seventeenth transistor. The seventeenth transistor has a control electrode coupled to the first pull-down node, and a second electrode coupled to the low-level voltage terminal. The eighteenth transistor has a control electrode coupled to the first pull-up node, a first electrode coupled to the second electrode of the sixteenth transistor, and a second electrode coupled to the high-level voltage terminal. The first feedback node is coupled to the first electrode of the eighteenth transistor.

In some embodiments, the second reset sub-circuit includes: a second transistor. The second transistor has a control electrode coupled to the second reset terminal, a first electrode coupled to the pull-up control node, and a second electrode coupled to the low-level voltage terminal.

In some embodiments, the second reset sub-circuit includes: a second transistor and a thirteenth transistor. The second transistor has a control electrode coupled to the second reset terminal, a first electrode coupled to the pull-up control node, and a second electrode coupled to a second feedback node. The thirteenth transistor has a control electrode coupled to the second reset terminal, a first electrode coupled to the second feedback node, and a second electrode coupled to the low-level voltage terminal. The detection sub-shift register further includes a second leakage prevention electronic circuit. The second leakage prevention sub-circuit is coupled to the pull-up control node, the high-level voltage terminal and the second feedback node, and configured to provide the signal of the high-level voltage terminal to the second feedback node under the control of the pull-up control node, to maintain the on level of the pull-up control node. The second leakage prevention sub-circuit includes: a fourteenth transistor. The fourteenth transistor has a control electrode coupled to the pull-up control node, a first electrode coupled to the high-level voltage terminal, and a second electrode coupled to the second feedback node.

In some embodiments, the detection reset sub-circuit includes: a first reset sub-circuit and a second reset sub-circuit. The first reset sub-circuit is coupled to the first pull-up node, the low-level voltage terminal, and the first reset terminal, and configured to provide the signal of the low-level voltage terminal to the first pull-up node under the control of the first reset terminal. The second reset sub-circuit is coupled to the second reset terminal, the pull-up control node and the low-level voltage terminal, and configured to provide the signal of the low-level voltage terminal to the pull-up control node under the control of the second reset terminal. The second reset sub-circuit includes: a second transistor and a thirteenth transistor. The second transistor has a control electrode coupled to the second reset terminal, a first electrode coupled to the pull-up control node, and a second electrode coupled to the second feedback node. The thirteenth transistor has a control electrode coupled to the second reset terminal, a first electrode coupled to the second feedback node, and a second electrode coupled to the low-level voltage terminal. The detection sub-shift register further includes a second leakage prevention electronic circuit. The second leakage prevention sub-circuit is coupled to the pull-up control node, the high-level voltage terminal and the second feedback node, and configured to provide the signal of the high-level voltage terminal to the second feedback node under the control of the pull-up control node, to maintain the on level of the pull-up control node.

In some embodiments, the second leakage prevention sub-circuit includes: a fourteenth transistor. The fourteenth transistor has a control electrode coupled to the pull-up control node, a first electrode coupled to the high-level voltage terminal, and a second electrode coupled to the second feedback node. The second feedback node is coupled to the second electrode of the first transistor.

In some embodiments, the detection output sub-circuit includes: an eighth transistor and a ninth transistor. The eighth transistor has a control electrode coupled to the first pull-up node, a first electrode coupled to the third clock signal terminal, and a second electrode coupled to the first output terminal. The ninth transistor has a control electrode coupled to the first pull-up node, a first electrode coupled to the fourth clock signal terminal, and a second electrode coupled to the second output terminal. The detection output control sub-circuit includes: a tenth transistor and an eleventh transistor. The tenth transistor has a control electrode coupled to the first pull-down node, a first electrode coupled to the first output terminal, and a second electrode coupled to the low-level voltage terminal. The eleventh transistor has a control electrode coupled to the first pull-down node, a first electrode coupled to the second output terminal, and a second electrode coupled to the low-level voltage terminal.

In some embodiments, the detection output sub-circuit further includes: a second capacitor and a third capacitor. The second capacitor has a first end coupled to the first pull-up node, and a second end coupled to the first output terminal. The third capacitor has a first end coupled to the first pull-up node, and a second end coupled to the second output terminal.

In some embodiments, the display sub-shift register includes: a display input sub-circuit, which is coupled to a second input terminal, a fifth clock signal terminal, and a second pull-up node, and configured to provide a signal of the second input terminal to the second pull-up node under the control of the fifth clock signal terminal; a display output sub-circuit, which is coupled to a sixth clock signal terminal, the second pull-up node, a cascade output terminal, and a third output terminal, and configured to provide a signal of the sixth clock signal terminal to the cascade output terminal and the third output terminal under the control of the second pull-up node; a display reset sub-circuit, which is coupled to a third reset terminal, the second pull-up node and the low-level voltage terminal, and configured to provide the signal of the low-level voltage terminal to the second pull-up node under the control of the third reset terminal; a display output control sub-circuit, which is coupled to the cascade output terminal, the third output terminal, a second pull-down node, and the low-level voltage terminal, and configured to provide the signal of the low-level voltage terminal to the cascade output terminal and the third output terminal under the control of the second pull-down node; a display node control sub-circuit, which is coupled to a third control terminal, a fourth control terminal, the second pull-up node, the second pull-down node, and the low-level voltage terminal, and configured to provide the signal of the low-level voltage terminal to the second pull-down node under the control of the third control terminal, the fourth control terminal, and the second pull-up node. The display control terminal is coupled to the cascade output terminal such that the detection sub-shift register does not operate when the display sub-shift register operates.

In some embodiments, the display sub-shift register further includes a second control sub-circuit, which is coupled to the second pull-up node, the second pull-down node, a detection control terminal, the high-level voltage terminal, and the low-level voltage terminal, and configured to provide the signal of the low-level voltage terminal to the second pull-up node and the second pull-down node under the control of the detection control terminal. The detection control terminal is coupled to the first pull-up node.

In a second aspect, the embodiments of the present disclosure further provide a gate driving circuit including a plurality of the above shift registers which are cascaded, each stage of shift register including a display sub-shift register and a detection sub-shift register. The display sub-shift register includes: a cascade output terminal, a second input terminal, a third output terminal, a third reset terminal, and a detection control terminal. The first input terminal of the detection sub-shift register of the first stage of shift register is coupled to a first initial signal terminal, the first input terminal of the detection sub-shift register of the N-th stage of shift register is coupled to the first pull-up node of the detection sub-shift register of the (N−1)-th stage of shift register, and the second reset terminal of the detection sub-shift register of the N-th stage of shift register is coupled to the first pull-up node of the detection sub-shift register of the (N+1)-th stage of shift register. The second input terminal of the display sub-shift register of the first stage of shift register is coupled to a second initial signal terminal, the second input terminal of the display sub-shift register of the N-th stage of shift register is coupled to the cascade output terminal of the display sub-shift register of the (N−1)-th stage of shift register, and the third reset terminal of the display sub-shift register of the N-th stage of shift register is coupled to the cascade output terminal of the display sub-shift register of the (N+1)-th stage of shift register. The detection control terminal of the display sub-shift register of the N-th stage of shift register is coupled to the first pull-up node of the detection sub-shift register of the N-th stage of shift register, the cascade output terminal of the display sub-shift register of the N-th stage of shift register is coupled to the display control terminal of the detection sub-shift register of the N-th stage of shift register, and the third output terminal of the display sub-shift register of the N-th stage of shift register is coupled to the first output terminal of the detection sub-shift register of the N-th stage of shift register. N is an integer greater than or equal to two.

In a third aspect, the embodiments of the present disclosure further provide a method of driving a shift register, the shift register including a display sub-shift register and a detection sub-shift register coupled to the display sub-shift register. The method includes: in a first stage, providing a signal of a second clock signal terminal having an on level to a first pull-up node of the detection sub-shift register, and providing a signal of a low-level voltage terminal to a first output terminal of the detection sub-shift register; in a second stage, providing a signal of the second clock signal terminal having an off level to the first pull-up node of the detection sub-shift register, and providing the signal of the low-level voltage terminal to the first output terminal of the detection sub-shift register; in a third stage, providing a signal of the second clock signal terminal having an on level to the first pull-up node of the detection sub-shift register, and providing a signal of a third clock signal terminal having an on level to the first output terminal of the detection sub-shift register; in a fourth stage, providing the signal of the low-level voltage terminal to the first pull-up node and the first output terminal of the detection sub-shift register; and in a fifth stage, making the first pull-up node of the detection sub-shift register maintain the level in the fourth stage, and providing the signal of the low-level voltage terminal to the first output terminal of the detection sub-shift register. A time period in which the signal of the first pull-up node is at the on level at least partially overlaps with a time period in which the signal of the first output terminal is at the on level, and when the signal of the first pull-up node is at the off level, the signal of the first output terminal is at the off level.

In a fourth aspect, the embodiments of the present disclosure further provide a display device including the above gate driving circuit.

Other features and advantages of the present disclosure will be set forth in the following description, and some of them become obvious according to the description or will be understood by implementing the present disclosure. The objectives and other advantages of the present disclosure can be realized and obtained by the structure particularly stated in the description, appended claims and drawings.

BRIEF DESCRIPTION OF DRAWINGS

The accompanying drawings, which constitute a part of the specification, are provided for further understanding of the technical solutions of the present disclosure, and for explaining the technical solutions of the present disclosure together with the embodiments of the present application, but not intended to limit the technical solutions of the present disclosure.

DETAILED DESCRIPTION

The steps illustrated in the flowchart of the figures may be executed in a computer system such as a set of computer executable instructions. Also, although the logical sequence is shown in the flowcharts, in some cases the steps shown or described may be performed in a different sequence from the sequence described herein.

Unless otherwise defined, technical terms or scientific terms used in the disclosure of the embodiments of the present disclosure should have the ordinary meaning as understood by those of ordinary skill in the art to which the present application belongs. The words "first", "second" and similar terms used in the embodiments of the present disclosure do not denote any order, quantity, or importance, but are merely used to distinguish different components. The word "comprising", "comprises" or the like means that the element or item, and its equivalent, that precedes the word contains the element or the item that is listed after the word, and does not exclude other element or item. The word "connected", "coupled" or the like is not limited to a physical or mechanical connection, but may include an electrical connection, whether direct or indirect. The words "upper", "lower", "left", "right", etc. are only used to indicate relative positional relationships, and when the absolute position of the object being described is changed, the relative positional relationship may also change accordingly.

Herein, the "on level" refers to a level by which the thin film transistor can be driven to be turned on, and the "off level" refers to a level by which the thin film transistor can be driven to be turned off. For example, for an N-type thin film transistor, the on level is a high level and the off level is a low level.

Pixel circuits in an OLED display device are generally driven in a matrix manner, and the driving manner is divided into an active matrix driving and a passive matrix driving according to whether or not a switch component is introduced into each pixel unit. An active matrix driven OLED (AMOLED) display device integrates a set of thin film transistor(s) and storage capacitor(s) in the pixel circuit of each pixel, and controls the current flowing through the OLED by controlling the driving of the thin film transistor(s) and the storage capacitor(s), thereby enabling the OLED to emit light as needed.

The basic pixel circuit used in the AMOLED display device is usually a 2T1C pixel circuit, that is, a function of driving the OLED to emit light is realized by using two thin film transistors (TFTs) and one storage capacitor Cst.

Figure 1A:
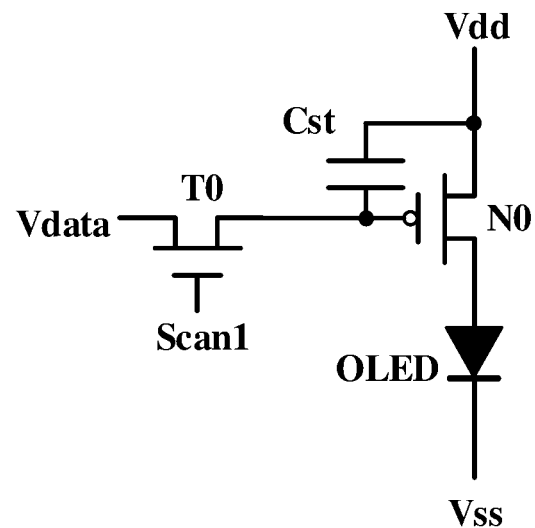
FIG. 1A is a schematic diagram of a pixel circuit.

FIG. 1A shows a schematic diagram of a 2T1C pixel circuit. As shown in FIG. 1A, a 2T1C pixel circuit includes a switch transistor T0, a driving transistor N0, and a storage capacitor Cst. For example, a gate electrode of the switch transistor T0 is coupled to a scan line to receive a scan signal Scan1. For example, a source electrode of the switch transistor T0 is coupled to a data line to receive a data signal Vdata, and a drain electrode of the switch transistor T0 is coupled to a gate electrode of the driving transistor N0. A source electrode of the driving transistor N0 is coupled to a first voltage terminal to receive the first voltage Vdd (high voltage), and a drain electrode of the driving transistor N0 is coupled to a positive electrode of the OLED. One end of the storage capacitor Cst is coupled to the drain electrode of the switch transistor T0 and the gate electrode of the driving transistor N0, and the other end thereof is coupled to the source electrode of the driving transistor N0 and the first voltage terminal. A negative electrode of the OLED is coupled to a second voltage terminal to receive the second voltage Vss (low voltage, such as ground voltage). The 2T1C pixel circuit is driven to control the brightness and darkness (grayscale) of the pixel through the two TFTs T0 and N0 and the storage capacitor Cst. When the scan signal Scan1 is applied through the scan line to turn on the switch transistor T0, the storage capacitor Cst can be charged via the switch transistor T0 by the data signal Vdata input by the data driving circuit through the data line, and thereby the data signal Vdata can be stored in the storage capacitor Cst. The stored data signal Vdata can control the conduction degree of the driving transistor N0 and thereby control the amount of the current flowing through the driving transistor N0 to drive the OLED to emit light, that is, this current determines the grayscale of the illumination of the pixel. In the 2T1C pixel circuit shown in FIG. 1, the switch transistor T0 is an N-type transistor and the driving transistor N0 is a P-type transistor.

The OLED display device typically includes a plurality of pixel units arranged in an array, and each of the pixel units may include, for example, the above-described pixel circuit. When the pixel circuit performs a display operation, the output current $I_{OLED}$ of the driving transistor N0 in the pixel circuit in a saturation state can be obtained according to the following formula:

$$I_{OLED} = \frac{1}{2} * K (Vg - Vs - Vth)^2,$$

where $K = W/L * C * \mu$, W/L is a width-to-length ratio (i.e., a ratio of the width to the length) of a channel of the driving transistor N0, $\mu$ is the electron mobility, C is the capacitance per unit area, Vg is the voltage of the gate electrode of the driving transistor N0, Vs is the voltage of the source electrode of the driving transistor N0, and Vth is the threshold voltage of the driving transistor N0. It should be noted that in the embodiments of the present disclosure, K is referred to as a current coefficient of a driving transistor in a pixel circuit.

The threshold voltages Vth of the driving transistors in respective pixel circuits may be different due to the fabrication process, and a drift phenomenon may occur to the threshold voltage Vth of the driving transistor due to, for example, a change in temperature. In the meantime, the current coefficient K of the driving transistor also ages over time. Therefore, the difference of the threshold voltages Vth and the current coefficients K of respective driving transistors and the aging of the current coefficient may cause display defects (for example, display unevenness), so it is necessary to compensate the threshold voltage Vth and the current coefficient K.

For example, after the data signal (e.g., the data voltage) Vdata is applied to the gate electrode of the driving transistor N0 via the switch transistor T0, the data signal Vdata can charge the storage capacitor Cst, and since the data signal Vdata can turn on the driving transistor N0, the voltage Vs of the source electrode or the drain electrode of the driving transistor N0 electrically coupled to one end of the storage capacitor Cst may be changed correspondingly.

Figure 1B:
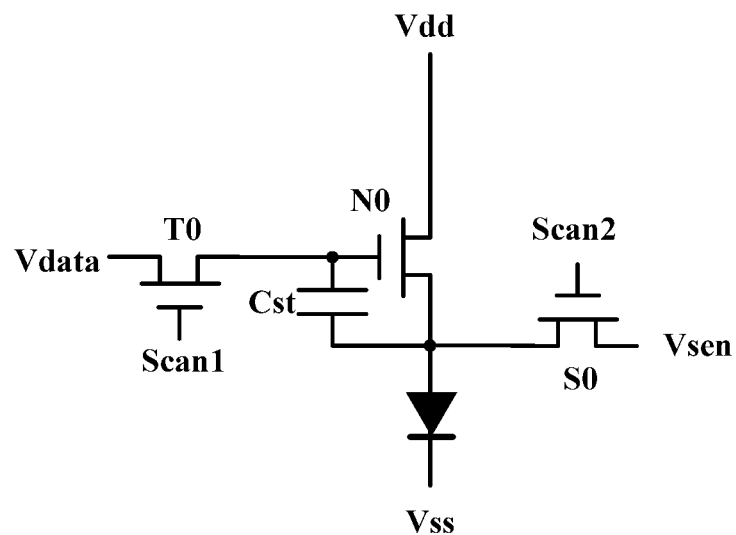
FIG. 1B is a schematic diagram of another pixel circuit.

FIG. 1B shows a pixel circuit (that is, a 3T1C circuit) that can detect a threshold voltage of a driving transistor, and the driving transistor N0 is an N-type transistor. For example, as shown in FIG. 1B, in order to implement the compensation function, a sensing transistor S0 may be introduced on the basis of the 2T1C circuit. That is, a first electrode of the sensing transistor S0 may be coupled to the source electrode of the driving transistor N0, a second electrode of the sensing transistor S0 is coupled to a detection circuit (not shown) via the sensing line Vsen, and a gate electrode of the sensing transistor S0 receives the compensation scan signal Scan2. Therefore, after the driving transistor N0 is turned on, the compensation scan signal Scan2 can be applied so that the detection circuit is charged via the sensing transistor S0 to change the voltage level of the source electrode of the driving transistor N0. When the voltage Vs of the source electrode of the driving transistor N0 is equal to the difference between the gate voltage Vg of the driving transistor N0 and the threshold voltage Vth of the driving transistor N0, the driving transistor N0 is cut off. At this time, after the driving transistor N0 is cut off, the sensing voltage (that is, the voltage Vb of the source electrode of the cut-off driving transistor N0) can be acquired from the source electrode of the driving transistor N0 via the turned-on sensing transistor S0. After acquiring the voltage Vb of the source electrode of the cut-off driving transistor N0, the threshold voltage Vth of the driving transistor can be acquired according to Vth=Vdata−Vb, so a compensation data can be established (i.e., determined) for each pixel circuit based on the threshold voltage of the driving transistor in each pixel circuit, and thus compensation of the threshold voltage of each pixel unit of the display panel can be realized.

During the increase of the voltage Vs of the source electrode of the driving transistor N0 to (Vdata−Vth), the value of [(Vdata−Vth)−Vs] will continuously decrease as the voltage Vs increases, and accordingly, the current $I_{OLED}$ output by the driving transistor N0 and charging rate will continuously decrease, so the time Ts from the beginning of charging to the cutting off of the driving transistor N0 is long. Therefore, detection of the threshold voltage usually needs to be performed during the shutdown process after the display panel ends the normal display.

In an OLED panel employing the pixel circuit (e.g., the circuit as shown in FIG. 1B) that detect and compensate the threshold voltage of the driving transistor, each shift register of the GOA circuit typically includes a display part and a detection part correspondingly. The display part is configured to drive the image display, the detection part is configured to drive detection and/or compensation of the non-uniformity of threshold voltage and mobility of the driving transistor N0, aging of the OLED, and the like in the pixel circuit, and both of them are indispensable.

However, the input of the detection part in each stage of shift register is coupled to the output of the detection part in the previous stage of shift register, so that the input of the detection part in the next stage of shift register is affected by the load of the detection part of the current stage of shift register, not only weakening the cascading capability of the entire GOA circuit, but also affecting the stability of display and display effect.

In order to solve at least the above technical problem, embodiments of the present disclosure provide a shift register, a method of driving the same, and a gate driving circuit.

Figure 2:
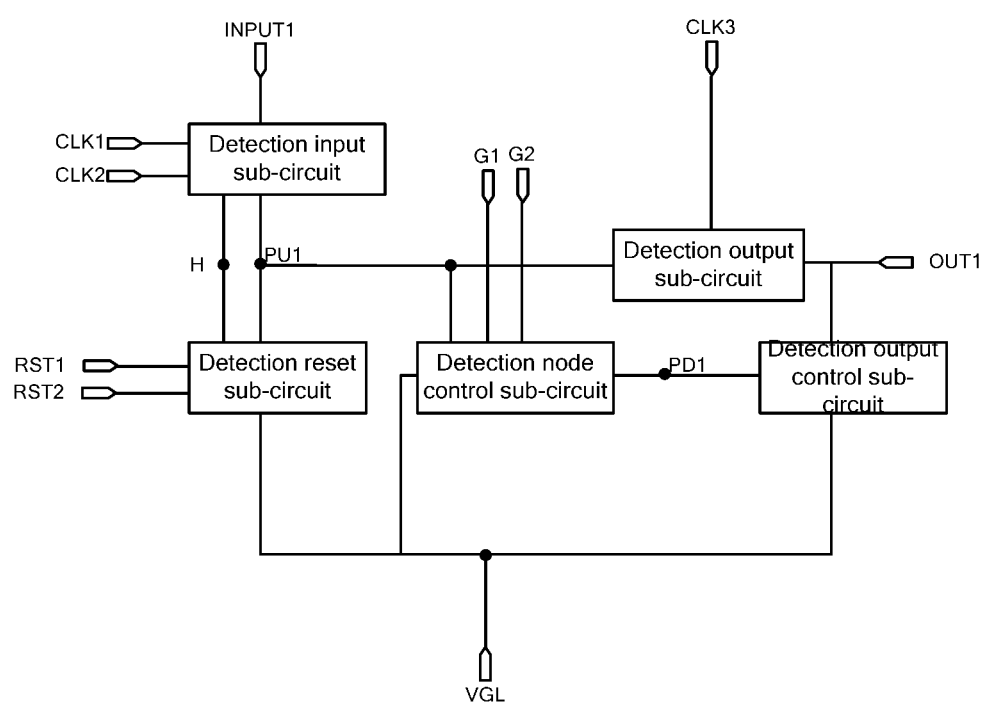
FIG. 2 is a structural schematic diagram of a detection sub-shift register according to an embodiment of the present disclosure.

Embodiments of the present disclosure provide a shift register. The shift register includes a display sub-shift register and a detection sub-shift register coupled to the display sub-shift register, the display sub-shift register is configured to drive a pixel circuit to display, and the detection sub-shift register is configured to drive detection and/or compensation of a device threshold voltage or the like of the pixel circuit. FIG. 2 is a structural block diagram of a detection sub-shift register according to an embodiment of the present disclosure. As shown in FIG. 2, the detection sub-shift register according to an embodiment of the present disclosure includes: a detection input sub-circuit, a detection output sub-circuit, a detection reset sub-circuit, a detection node control sub-circuit, and a detection output control sub-circuit.

In an embodiment, the detection input sub-circuit is coupled to a first clock signal terminal CLK1, a second clock signal terminal CLK2, a first input terminal INPUT1, a pull-up control node H and a first pull-up node PU1, and configured to provide a signal of the first input terminal INPUT1 to the pull-up control node H under the control of the first clock signal terminal CLK1, and provide a signal of the second clock signal terminal CLK2 to the first pull-up node PU1 under the control of the pull-up control node H. The detection output sub-circuit is coupled to the first pull-up node PU1, a third clock signal terminal CLK3 and the first output terminal OUT1, and configured to provide a signal of the third clock signal terminal CLK3 to the first output terminal OUT1 under the control of the first pull-up node PU1.

A display output signal output by the display sub-shift register is used to control the image display of a display panel. The detection sub-shift register is configured to output a detection output signal of a shift register unit, which is used to drive detection and/or compensation of the non-uniformity of threshold voltage and mobility of a driving transistor, aging of an OLED, and the like in a pixel circuit. For example, the detection sub-shift register may be configured to drive the sensing transistor S0 of the pixel circuit as shown in FIG. 1B, so that the sensing transistor S0 and the detection circuit (not shown) can detect the non-uniformity of threshold voltage and/or mobility of the driving transistor, aging of an OLED, and the like, thereby achieving a corresponding compensation function.

A plurality of the above shift registers (each of which includes the detection sub-shift register shown in FIG. 2) may be cascaded to constitute a GOA circuit. In N cascaded shift registers, an input signal of the first input terminal INPUT1 of the detection sub-shift register of each of the second to N-th stages of shift registers is the signal of the first pull-up node PU1 in the detection sub-shift register of the previous stage of shift register.

In an embodiment, the input signals of the first clock signal terminal CLK1 and the second clock signal terminal CLK2 are periodic signals and are adjustable. The periods of the input signals of the first clock signal terminal CLK1 and the second clock signal terminal CLK2 are the same, the period of the input signal of the third clock signal terminal CLK3 is shorter than that of the first clock signal terminal CLK1, and the pulse duration of the input signal of the third clock signal terminal CLK3 is shorter than that of the first clock signal terminal CLK1.

In the present embodiment, the input signal of the first input terminal INPUT1 of the detection sub-shift register of the current stage of shift register is the signal of the first pull-up node PU1 in the detection sub-shift register of the previous stage of shift register, and the signal of the first pull-up node PU1 in the detection sub-shift register of the previous stage of shift register is related to the signal of the second clock signal terminal but independent of the load of the previous stage of shift register, thereby avoiding influence of the load of the detection sub-shift register of the previous stage of shift register.

In the embodiments of the present disclosure, by providing the signal of the first pull-up node of the detection sub-shift register of the previous stage of shift register to the first input terminal of the detection sub-shift register of the current stage of shift register, the signal of the first input terminal is dependent on the signal of the second clock signal terminal only, and is not affected by the load of the detection sub-shift register of the previous stage of shift register, not only improving the cascading capability of the entire GOA circuit, but also ensuring the stability of display and display effect.

In an embodiment, the detection output control sub-circuit is coupled to the first output terminal OUT1, a first pull-down node PD1 and a low-level voltage terminal VGL, and configured to provide a signal of the low-level voltage terminal VGL to the first output terminal OUT1 under the control of the first pull-down node PD1. The detection reset sub-circuit is coupled to a first reset terminal RST1, a second reset terminal RST2, the first pull-up node PU1, the pull-up control node H and the low-level voltage terminal VGL, and configured to provide the signal of the low-level voltage terminal VGL to the first pull-up node PU1 under the control of the first reset terminal RST1, and provide the signal of the low-level voltage terminal VGL to the pull-up control node H under the control of the second reset terminal RST2. The detection node control sub-circuit is coupled to a first control terminal G1, a second control terminal G2, the first pull-up node PU1, the first pull-down node PD1, and the low-level voltage terminal VGL, and configured to provide the signal of the low-level voltage terminal VGL to the first pull-down node PD1 under the control of the first control terminal G1, the second control terminal G2, and the first pull-up node PU1.

In order to ensure that the signals of the third clock signal terminal CLK3 and the fourth clock signal terminal CLK4 are completely output to the first output terminal OUT1 and a second output terminal OUT2, it is necessary to make a voltage level of the high-level signals of the first clock signal terminal CLK1 and the second clock signal terminal CLK2 higher than a voltage level of the high-level signals of the third clock signal terminal CLK3 and the fourth clock signal terminal CLK4, so as to ensure the transistors (for example, the eighth and ninth transistors M8 and M9 in FIGS. 5A to 5H) of the detection output sub-circuit for transmitting the signals of the third clock signal terminal CLK3 and the fourth clock signal terminal CLK4 to be completely turned on.

In an embodiment, the low-level voltage terminal VGL continuously provides a low-level signal. It should be noted that the low-level voltage terminals VGL to which the detection node control sub-circuit, the detection reset sub-circuit, the detection output control sub-circuit, and the first control sub-circuit are respectively coupled may be the same, or may be different, which is determined according to actual needs, and is not limited in the embodiments of the present disclosure. Hereinafter, a case where these sub-circuits are coupled to the same low-level voltage terminal will be described as an example.

In some embodiments, the signals of the first control terminal G1 and the second control terminal G2 may be alternate DC high-level signals (that is, when one of the signals of the first control terminal G1 and the second control terminal G2 is at a high level, the other one is at a low level). Alternatively, they may be alternate low-frequency clock signals, and the periods of the signals of the first control terminal G1 and the second control terminal G2 are longer than an operation period of the shift register. That is, in one operation cycle, one of the first control terminal G1 and the second control terminal G2 is constantly at a high level.

Figure 3:
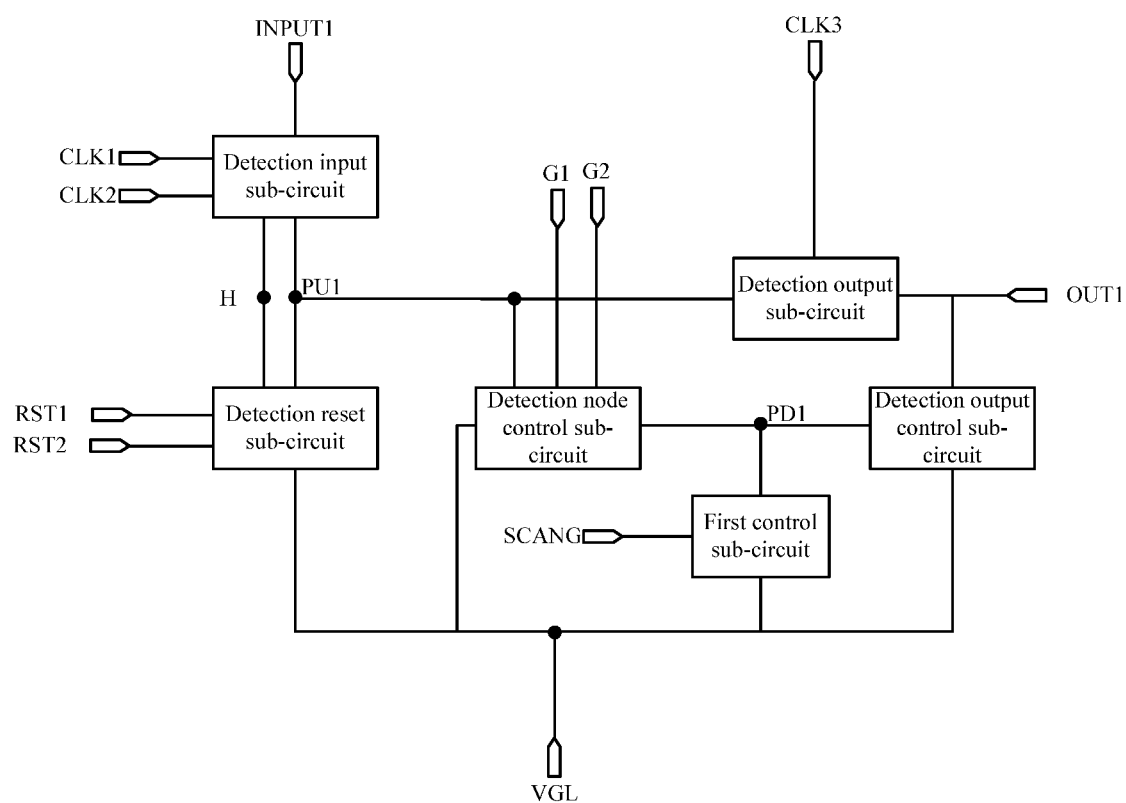
FIG. 3 is another structural schematic diagram of a detection sub-shift register according to an embodiment of the present disclosure.

FIG. 3 is still another schematic structural diagram of a detection sub-shift register according to an embodiment of the present disclosure. As shown in FIG. 3, in addition to the structure shown in FIG. 2, the detection sub-shift register may further include a first control sub-circuit.

In an embodiment, the first control sub-circuit is coupled to a display control terminal SCANG, the first pull-down node PD1, and the low-level voltage terminal VGL, and is configured to provide the signal of the low-level voltage terminal VGL to the first pull-down node PD1 under the control of the display control terminal SCANG.

It should be noted that the display control terminal SCANG is coupled to the display sub-shift register. In one example, referring to FIG. 14, the display control terminal SCANG of the detection sub-shift register is coupled to a cascade output terminal CR of the display sub-shift register, as will be described later.

Figure 5A:
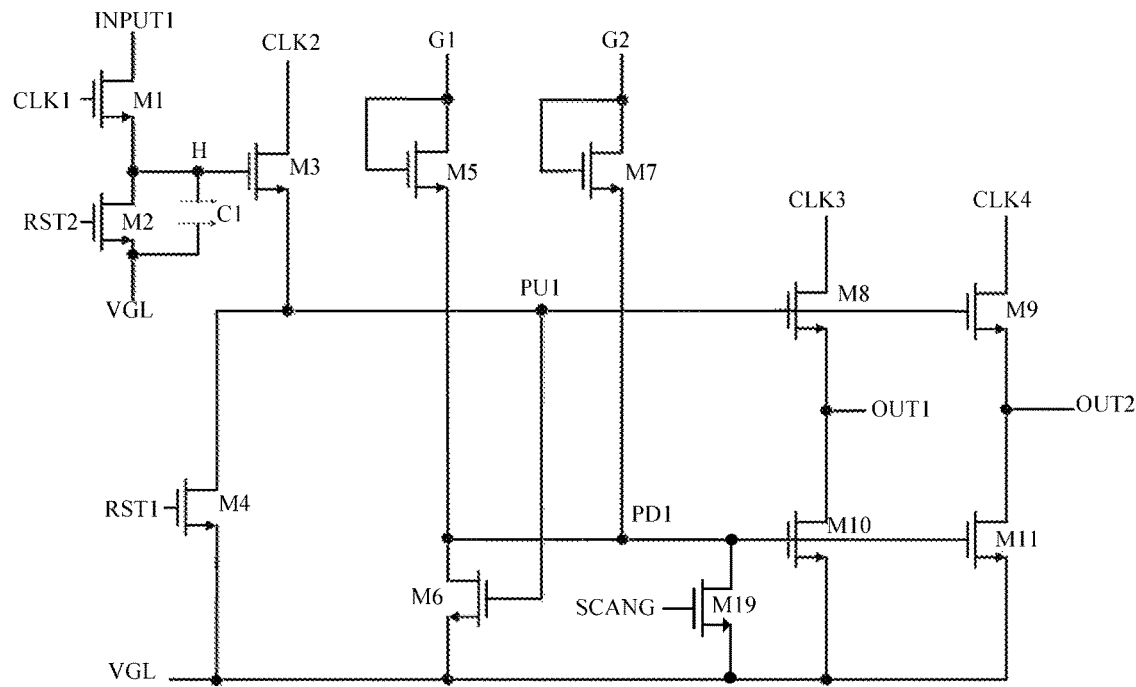
FIG. 5A is a circuit diagram of a detection sub-shift register according to an embodiment of the present disclosure.
Figure 5B:
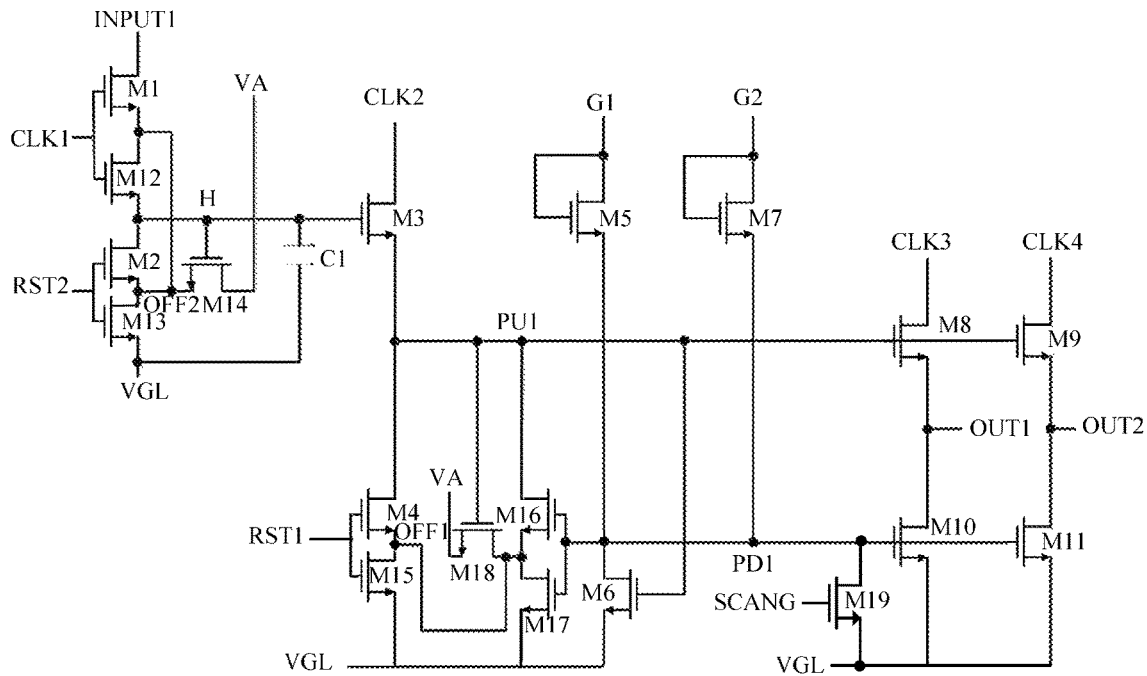
FIG. 5B is a circuit diagram of a detection sub-shift register according to an embodiment of the present disclosure.
Figure 5C:
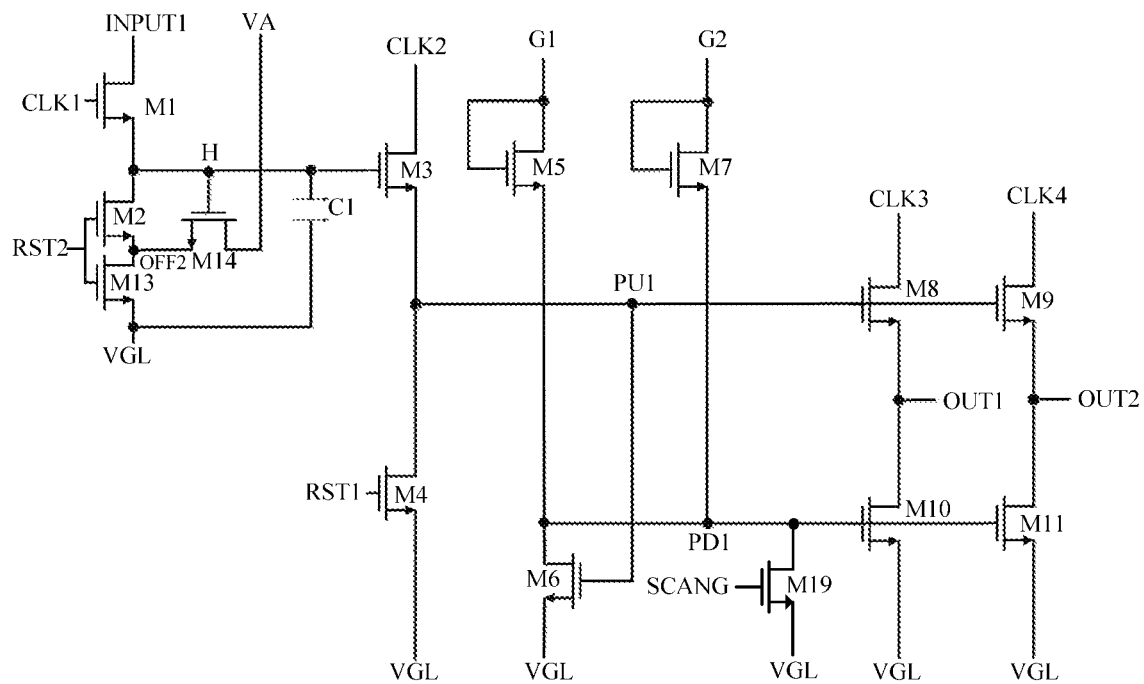
FIG. 5C is a circuit diagram of a detection sub-shift register according to an embodiment of the present disclosure.
Figure 5D:
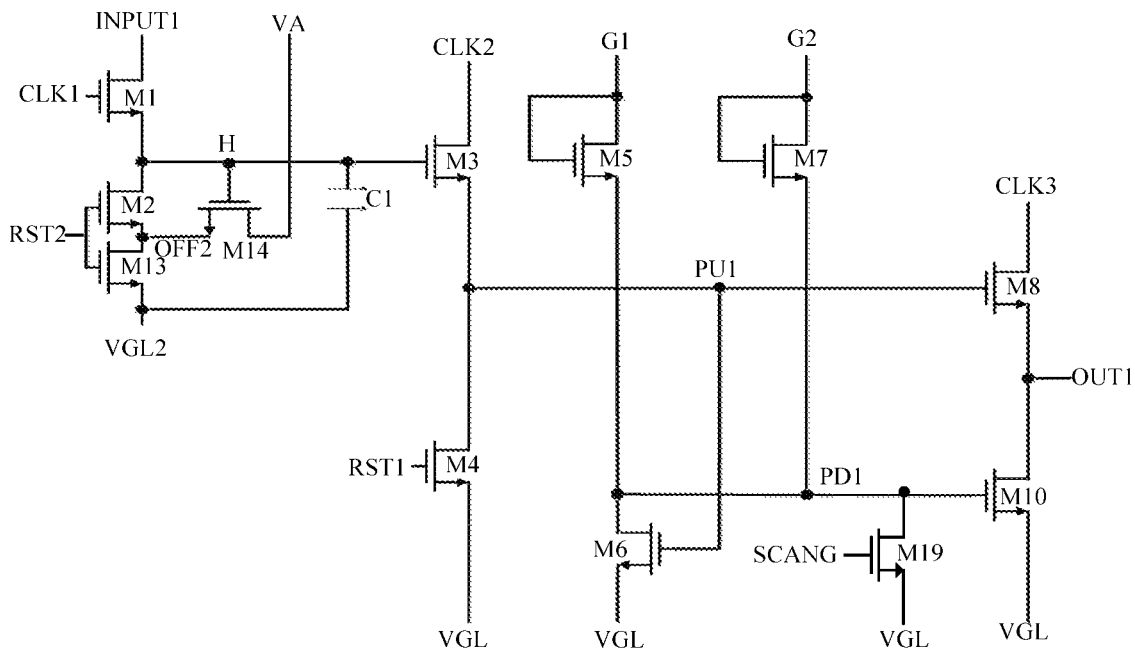
FIG. 5D is a circuit diagram of a detection sub-shift register according to an embodiment of the present disclosure.
Figure 5E:
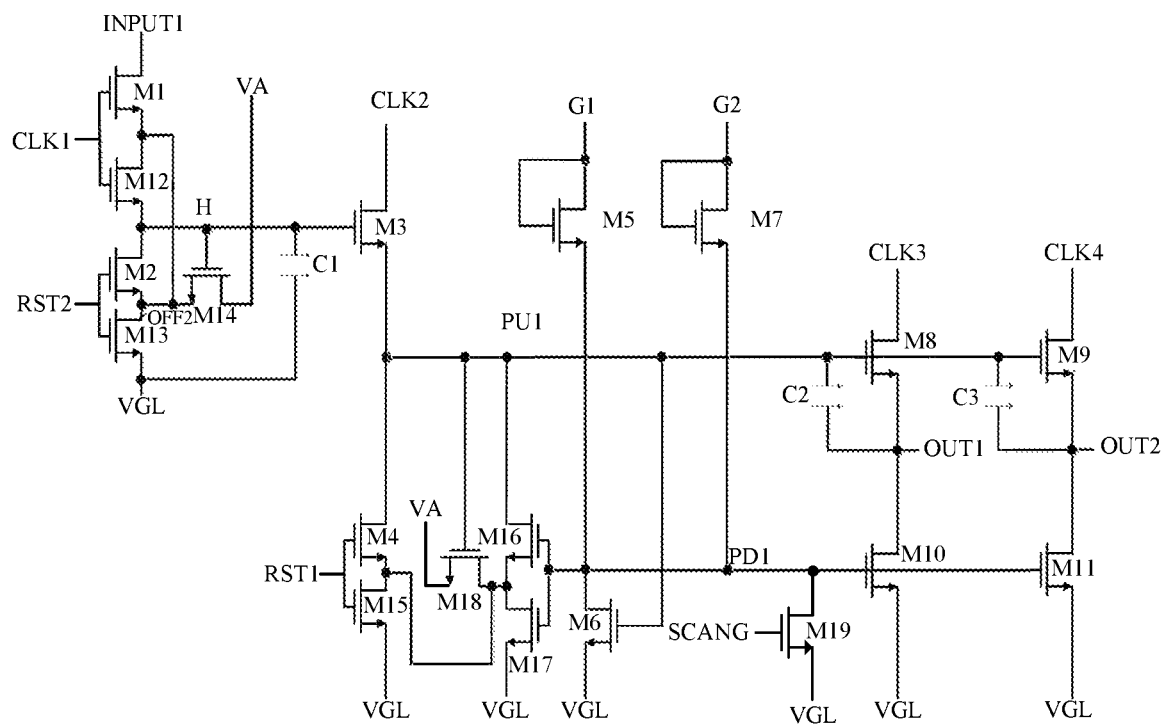
FIG. 5E is a circuit diagram of a detection sub-shift register according to an embodiment of the present disclosure.
Figure 5F:
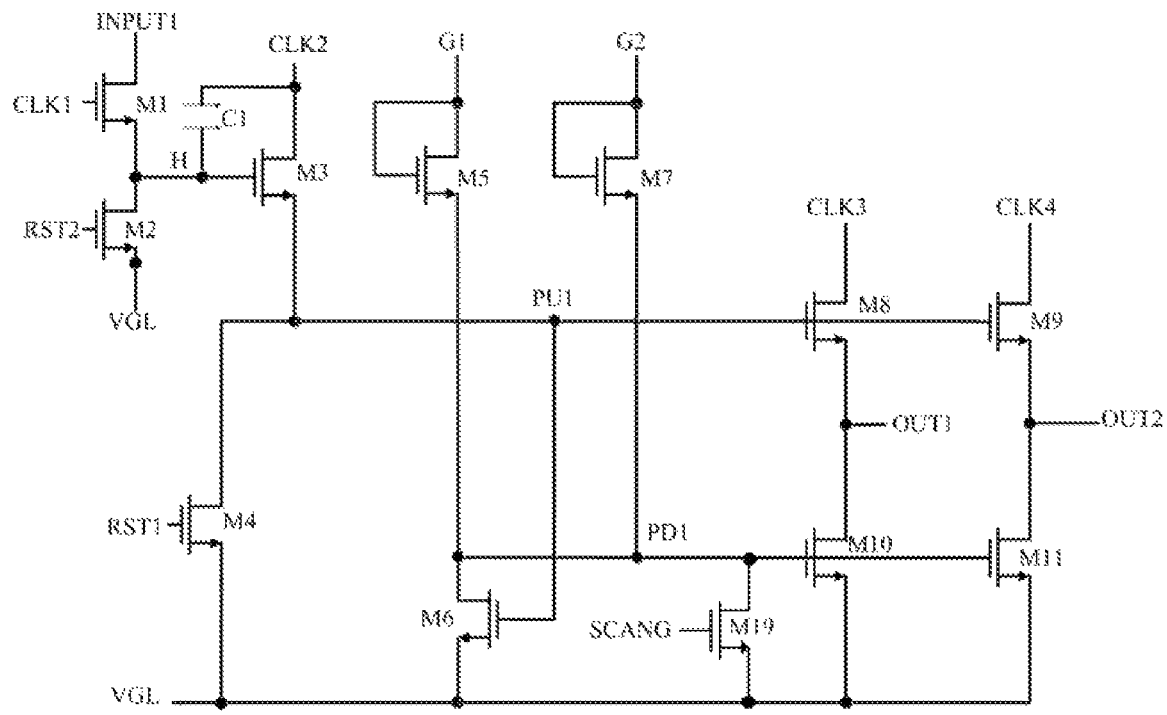
FIG. 5F is a circuit diagram of a detection sub-shift register according to an embodiment of the present disclosure.
Figure 5G:
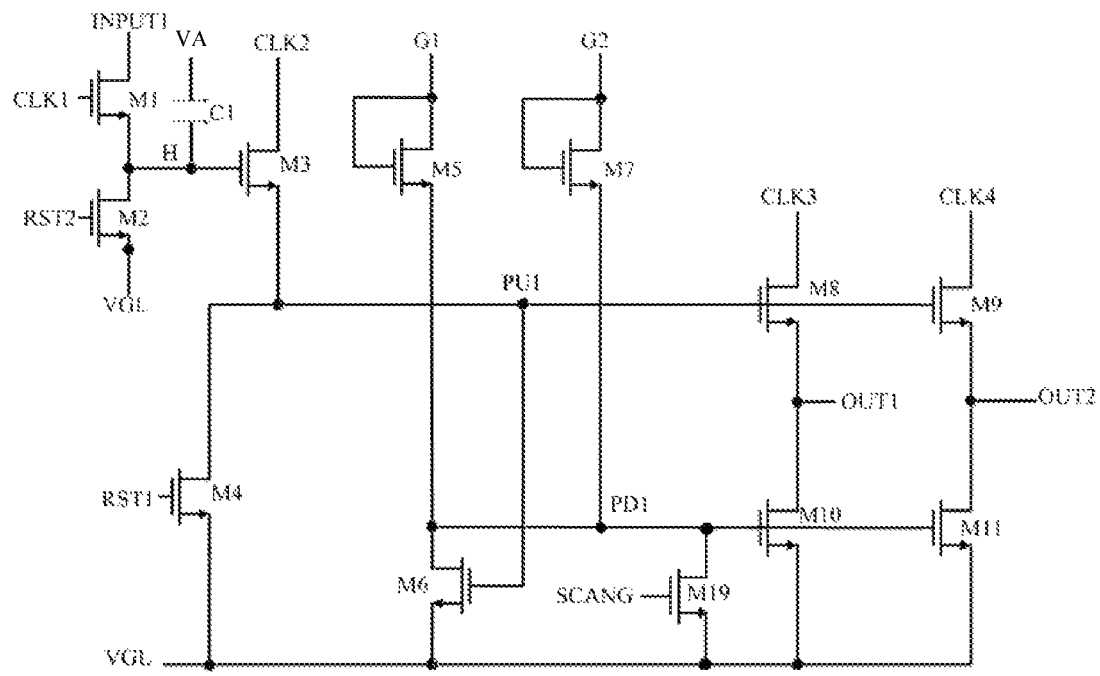
FIG. 5G is a circuit diagram of a detection sub-shift register according to an embodiment of the present disclosure.

In order to prevent leakage of a transistor, a voltage level of the off signal provided to the first reset terminal, the second reset terminal and the first clock signal terminal according to an embodiment of the present disclosure is lower than a voltage level of the signal of the low voltage terminal. Taking a case where the off signal is a low-level signal as an example, in order to ensure that the device (for example, the second transistor M2 as shown in FIGS. 5A, 5F, and 5G) for providing the signal of the low-level voltage terminal under the control of the second reset terminal is completely turned off in the output stage, a voltage level of the low level signal of the second reset terminal RST2 is lower than the voltage level of the signal of the low voltage terminal. For example, the voltage level of the low-level signal of the second reset terminal RST2 is −6V, and the voltage level of the signal of the low-level voltage terminal VGL is −3V. In this case, the second transistor M2 cannot be turned on even if there is a negative bias of −3V. Similarly, in order to ensure that the device (for example, the first transistor M1 as shown in FIGS. 5A to 5H) for providing the signal of the first input terminal under the control of the first clock signal terminal is completely turned off in the output stage, a voltage level of the low level signal of the first clock signal terminal CLK1 is lower than the voltage level of the signal of the first input terminal INPUT1. In order to ensure that the device (for example, the fourth transistor M4 as shown in FIGS. 5A to 5H) for providing the signal of the low-level voltage terminal under the control of the first reset terminal is completely turned off in the output stage, a voltage level of the low level signal of the first reset terminal RST1 is lower than the voltage level of the signal of the low voltage terminal VGL. For example, the voltage level of the low level signal of the first reset terminal RST1 is −10V, and the voltage level of the signal of the low level voltage terminal VGL is −6V. In the embodiments of the present disclosure, by controlling the low level signals of the first reset terminal, the second reset terminal and the first clock signal terminal to ensure voltage levels of these low level signals lower than the voltage level of the signal of the low-level voltage terminal VGL, the leakage of the transistor is prevented, and the voltage level of the first pull-up node PU1 is maintained, thereby ensuring that an abnormal output due to the leakage of the first pull-up node PU1 will not occur in the detection sub-shift register according to the embodiments of the present disclosure even if the output time is long.

It should be noted that a high level signal of a signal terminal refers to a signal serving as the input signal of the signal terminal and at a high level, and a low level signal of a signal terminal refers to a signal serving as the input signal of the signal terminal and at a low level.

In the embodiments of the present disclosure, by adding the detection node control sub-circuit, the detection reset sub-circuit, and the detection output control sub-circuit in the detection sub-shift register, noise in the detection sub-shift register can be reduced, thereby further improving the stability, reliability and display effects of the display panel.

In the embodiments of the present disclosure, by adding the first control sub-circuit in the detection sub-shift register, an output of the detection sub-shift register is controlled through the display control terminal. For example, the first control sub-circuit is controlled through the display control terminal to pull down the levels of the first pull-down node and the first pull-up node, so that the detection sub-shift register has no output. The display control terminal SCANG may be coupled to the display sub-shift register, and a signal of the display control terminal SCANG is provided by the display sub-shift register so that when one of the display sub-shift register and the detection sub-shift register has an output, the other has no output.

Figure 4:
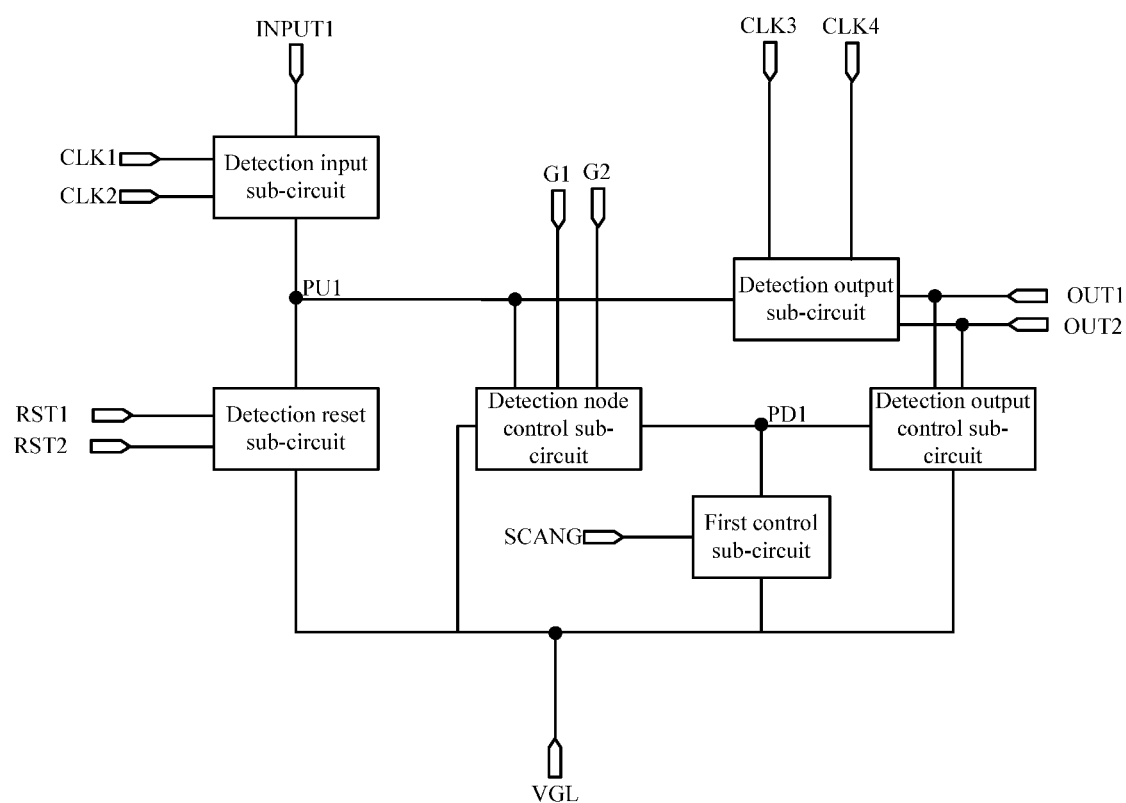
FIG. 4 is still another structural schematic diagram of a detection sub-shift register according to an embodiment of the present disclosure.

FIG. 4 is still another structural schematic diagram of a detection sub-shift register according to an embodiment of the present disclosure. The difference between the detection sub-shift register shown in FIG. 4 and that shown in FIG. 3 is as follows: the detection output sub-circuit in the detection sub-shift register shown in FIG. 4 is further coupled to a fourth clock signal terminal CLK4 and a second output terminal OUT2, and is further configured to provide a signal of the fourth clock signal terminal CLK4 to the second output terminal OUT2 under the control of the first pull-up node PU1; and the detection output control sub-circuit shown in FIG. 4 is further coupled to the second output terminal OUT2, and is further configured to provide the signal of the low-level voltage terminal VGL to the second output terminal OUT2 under the control of the first pull-down node PD1.

In the embodiments of the present disclosure, multiple outputs of the detection sub-shift register is realized by the connection of the detection output sub-circuit and the detection output control sub-circuit to the second output terminal, so that the shift register can simultaneously control multiple gate lines, reducing the occupied area of the shift register and achieving a narrow bezel of the display device.

FIG. 4 illustrates a case where the detection sub-shift register simultaneously controls two gate lines as an example, but the present disclosure is not limited thereto. The detection sub-shift register according to an embodiment of the present disclosure can simultaneously control N gate lines (N is greater than or equal to 2). In this case, the detection output sub-circuit is coupled to the first pull-up node, N clock signal terminals, and N output terminals, and configured to provide signals of the N clock signal terminals to the N output terminals, respectively, and the detection output control sub-circuit is coupled to the first pull-down node, the low-level voltage terminal, and the N output terminals, and configured to provide the signal of the low-level voltage terminal to the N output terminals, respectively.

It should be noted that the detection sub-shift register shown in FIG. 4 includes the first control sub-circuit, but the present disclosure is not limited thereto. FIG. 4 is merely intended to show the case where the detection sub-shift register has multiple outputs, and such a multi-output detection sub-shift register may also not include the first control sub-circuit.

FIG. 5A is a first circuit diagram of a detection sub-shift register according to an embodiment of the present disclosure; FIG. 5B is a second circuit diagram of a detection sub-shift register according to an embodiment of the present disclosure; FIG. 5C is a third circuit diagram of a detection sub-shift register according to an embodiment of the present disclosure; FIG. 5D is a fourth circuit diagram of a detection sub-shift register according to an embodiment of the present disclosure; FIG. 5E is a fifth circuit diagram of a detection sub-shift register according to an embodiment of the present disclosure; FIG. 5F is a sixth circuit diagram of a detection sub-shift register according to an embodiment of the present disclosure; FIG. 5G is a seventh circuit diagram of a detection sub-shift register according to an embodiment of the present disclosure; and FIG. 5H is an eighth circuit diagram of a detection sub-shift register according to an embodiment of the present disclosure.

As an implementation of the detection input sub-circuit, as shown in FIGS. 5A, 5C, 5D, 5F, and 5G, the detection input sub-circuit includes: a first transistor M1 and a third transistor M3.

In an embodiment, the first transistor M1 has a control electrode coupled to the first clock signal terminal CLK1, a first electrode coupled to the first input terminal INPUT1, and a second electrode coupled to the pull-up control node H. The third transistor M3 has a control electrode coupled to the pull-up control node H, a first electrode coupled to the second clock signal terminal CLK2, and a second electrode coupled to the first pull-up node PU1.

Figure 5H:
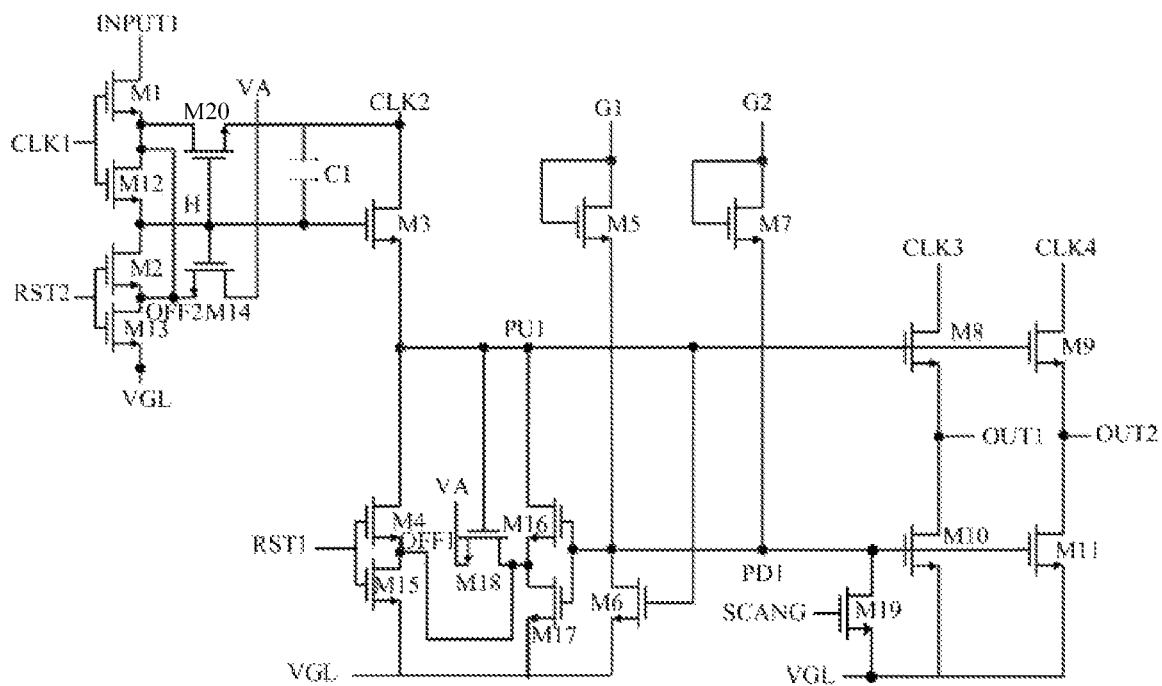
FIG. 5H is a circuit diagram of a detection sub-shift register according to an embodiment of the present disclosure.

As another implementation of the detection input sub-circuit, as shown in FIGS. 5B, 5E, and 5H, the detection input sub-circuit includes: a first transistor M1, a third transistor M3, and a twelfth transistor M12.

In an embodiment, the first transistor M1 has a control electrode coupled to the first clock signal terminal CLK1, a first electrode coupled to the first input terminal INPUT1, and a second electrode coupled to a first electrode of the twelfth transistor M12. The twelfth transistor M12 has a control electrode coupled to the first clock signal terminal CLK1, and a second electrode coupled to the pull-up control node H. The third transistor M3 has a control electrode coupled to the pull-up control node H, a first electrode coupled to the second clock signal terminal CLK2, and a second electrode coupled to the first pull-up node PU1.

In the present embodiment, an exemplary structure of the detection input sub-circuit is shown in FIGS. 5A to 5H. It will be readily understood by those skilled in the art that the implementation of the detection input sub-circuit is not limited thereto as long as the function thereof can be realized.

As shown in FIG. 5D, the detection output sub-circuit in the detection sub-shift register according to an embodiment of the present disclosure includes an eighth transistor M8, and the detection output control sub-circuit includes a tenth transistor M10. FIG. 5D is an example in which the detection sub-shift register has only one output.

In an embodiment, the eighth transistor M8 has a control electrode coupled to the first pull-up node PU1, a first electrode coupled to the third clock signal terminal CLK3, and a second electrode coupled to the first output terminal OUT1. The tenth transistor M10 has a control electrode coupled to the first pull-down node PD1, a first electrode coupled to the first output terminal OUT1, and a second electrode coupled to the low-level voltage terminal VGL.

As shown in FIGS. 5A, 5B, 5C, 5E, 5F, 5G and 5H, the detection output sub-circuit in the detection sub-shift register according to an embodiment of the present disclosure includes: an eighth transistor M8 and a ninth transistor M9.

In an embodiment, the eighth transistor M8 has a control electrode coupled to the first pull-up node PU1, a first electrode coupled to the third clock signal terminal CLK3, and a second electrode coupled to the first output terminal OUT1. The ninth transistor M9 has a control electrode coupled to the first pull-up node PU1, a first electrode coupled to the fourth clock signal terminal CLK4, and a second electrode coupled to the second output terminal OUT2.

As shown in FIGS. 5A, 5B, 5C, 5E, 5F, 5G and 5H, the detection output control sub-circuit in the detection sub-shift register according to an embodiment of the present disclosure includes: a tenth transistor M10 and an eleventh transistor M11.

In an embodiment, the tenth transistor M10 has a control electrode coupled to the first pull-down node PD1, a first electrode coupled to the first output terminal OUT1, and a second electrode coupled to the low-level voltage terminal VGL. The eleventh transistor M11 has a control electrode coupled to the first pull-down node PD1, a first electrode coupled to the second output terminal OUT2, and a second electrode coupled to the low-level voltage terminal VGL.

FIGS. 5A, 5B, 5C, 5E, 5F, 5G and 5H are examples in which the detection sub-shift register has two outputs. Needless to say, the circuits shown in FIGS. 5A, 5B, 5C, 5E, 5F, 5G and 5H can also be modified to have a single output. In this case, the detection output sub-circuit may include the eighth transistor M8 only, and the detection output control sub-circuit may include the tenth transistor M10 only. Similarly, although FIG. 5D is an example in which the detection sub-shift register has only one output, the present disclosure is not limited thereto, and the circuit shown in FIG. 5D may be modified to have two outputs, and the detection output sub-circuit and the detection output control sub-circuit are modified accordingly.

In the present embodiment, exemplary structures of the detection output sub-circuit and the detection output control sub-circuit are shown in FIGS. 5A to 5H. It will be readily understood by those skilled in the art that the implementations of the detection output sub-circuit and the detection output control sub-circuit are not limited thereto as long as the functions thereof can be realized.

In order to ensure the stability of the output, the detection output sub-circuit in the detection sub-shift register according to an embodiment of the present disclosure may further include a capacitor coupled between the first pull-up node and the output terminal.

For example, as shown in FIG. 5E, when the detection output sub-circuit includes two outputs, the detection output sub-circuit in the detection sub-shift register according to an embodiment of the present disclosure further includes: a second capacitor C2 and a third capacitor C3.

In an embodiment, the second capacitor C2 has a first end coupled to the first pull-up node PU1, and a second end coupled to the first output terminal OUT1. The third capacitor C3 has a first end coupled to the first pull-up node PU1, and a second end coupled to the second output terminal OUT2.

It should be noted that when the detection output sub-circuit includes only one output, the detection output sub-circuit in the detection sub-shift register according to an embodiment of the present disclosure includes only one capacitor, which has a first end coupled to the first pull-up node PU1, and a second end coupled to the first output terminal OUT1.

As shown in FIGS. 5A to 5H, the detection node control sub-circuit in the detection sub-shift register according to an embodiment of the present disclosure includes: a fifth transistor M5, a sixth transistor M6, and a seventh transistor M7.

In an embodiment, the fifth transistor M5 has a control electrode and a first electrode both coupled to the first control terminal G1, and a second electrode coupled to the first pull-down node PD1. The sixth transistor M6 has a control electrode coupled to the first pull-up node PU1, a first electrode coupled to the first pull-down node PD1, and a second electrode coupled to the low-level voltage terminal VGL. The seventh transistor M7 has a control electrode and a first electrode both coupled to the second control terminal G2, and a second electrode coupled to the first pull-down node PD1

In the present embodiment, an exemplary structure of the detection node control sub-circuit is shown in FIGS. 5A to 5H. It will be readily understood by those skilled in the art that the implementation of the detection node control sub-circuit is not limited thereto as long as the function thereof can be realized.

In some embodiments, the detection reset sub-circuit of the detection sub-shift register according to an embodiment of the present disclosure includes: a first reset sub-circuit and a second reset sub-circuit. The first reset sub-circuit is coupled to the first pull-up node PU1, the low-level voltage terminal VGL, and the first reset terminal RST1, and configured to provide the signal of the low-level voltage terminal VGL to the first pull-up node PU1 under the control of the first reset terminal RST1. The second reset sub-circuit is coupled to the second reset terminal RST2, the pull-up control node H and the low-level voltage terminal VGL, and configured to provide the signal of the low-level voltage terminal VGL to the pull-up control node H under the control of the second reset terminal RST2.

As an implementation of the first reset sub-circuit, as shown in FIGS. 5A, 5C, 5D, 5F and 5G, the first reset sub-circuit according to an embodiment of the present disclosure includes: a fourth transistor M4.

In an embodiment, the fourth transistor M4 has a control electrode coupled to the first reset terminal RST1, a first electrode coupled to the first pull-up node PU1, and a second electrode coupled to the low-level voltage terminal VGL.

As another implementation of the first reset sub-circuit, as shown in FIGS. 5B, 5E and 5H, the first reset sub-circuit according to an embodiment of the present disclosure includes: a fourth transistor M4 and a fifteenth transistor M15.

In an embodiment, the fourth transistor M4 has a control electrode coupled to the first reset terminal RST1, a first electrode coupled to the first pull-up node PU1, and a second electrode coupled to a first feedback node OFF1. The fifteenth transistor M15 has a control electrode coupled to the first reset terminal RST1, a first electrode coupled to the first feedback node OFF1, and a second electrode coupled to the low-level voltage terminal VGL.

In the detection sub-shift register shown in FIGS. 5B, 5E, and 5H, the fourth transistor M4 and the fifteenth transistor M15 are in a negative bias state for a long time, and leakage will occur when the signal of the first pull-up node PU1 is at a high level, which in turn affects the output. In order to prevent leakage of a transistor in a negative bias state for a long time and ensure display effect, the detection sub-shift register further includes: a first leakage prevention sub-circuit.

In an embodiment, the first leakage prevention sub-circuit is coupled to the first pull-up node PU1, the first pull-down node PD1, the first feedback node OFF1, a high-level voltage terminal VA, and the low-level voltage terminal VGL, and configured to, under the control of the first pull-down node PD1 and the first pull-up node PU1, provide the signal of the low-level voltage terminal VGL to the first feedback node OFF1 when the first pull-down node is at a high level, and provide a signal of the high-level voltage terminal VA to the first feedback node OFF1 when the first pull-up node PU1 is at a high level and the first pull-down node PD1 is at a low level, to maintain the high level of the first pull-up node PU1.

In an embodiment, the first leakage prevention sub-circuit includes: a sixteenth transistor M16, a seventeenth transistor M17, and an eighteenth transistor M18. The sixteenth transistor M16 has a control electrode coupled to the first pull-down node PD1, a first electrode coupled to the first pull-up node PU1, and a second electrode coupled to a first electrode of the seventeenth transistor M17. The seventeenth transistor M17 has a control electrode coupled to the first pull-down node PD1, and a second electrode coupled to the low-level voltage terminal VGL. The eighteenth transistor M18 has a control electrode coupled to the first pull-up node PU1, a first electrode coupled to the second electrode of the sixteenth transistor M16, and a second electrode coupled to the high-level voltage terminal VA. The first feedback node OFF1 is coupled to the first electrode of the eighteenth transistor M18.

In the present embodiment, when the first pull-up node PU1 is at a high level, the input signal of the first reset terminal RST1 is at a low level, and the fourth transistor M4 and the fifteenth transistor M15 are in a negative bias state for a long time. Since the first pull-up node PU1 is at a high level, the eighteenth transistor M18 is turned on, and a signal of the high-level voltage terminal VA is provided to the first feedback node OFF1. At this time, the first pull-down node PD1 is at a low level, the sixteenth transistor M16 and the seventeenth transistor M17 are turned off, and the signal of the first feedback node OFF1 is not pulled low. Since the signal of the first feedback node OFF1 is at a high level, one of the gate-to-source voltage differences of the fourth transistor M4 and the fifteenth transistor M15 has a value less than zero, so that leakage will not occur in the first reset sub-circuit, the first pull-up node PU1 maintains at a high level and the stability of the output is ensured. When the first pull-up node PU1 is at a low level, the first pull-down node PD1 is at a high level, the sixteenth transistor M16 and the seventeenth transistor M17 are turned on, and the voltage level of the first feedback node OFF1 is pulled down to the low level of the low-level voltage terminal VGL.

In the present embodiment, an exemplary structure of the first reset sub-circuit is shown in FIGS. 5A to 5H. It will be readily understood by those skilled in the art that the implementation of the first reset sub-circuit is not limited thereto as long as the function thereof can be realized.

As an implementation of the second reset sub-circuit, as shown in FIGS. 5A, 5F, and 5G, the second reset sub-circuit according to an embodiment of the present disclosure includes: a second transistor M2.

In an embodiment, the second reset sub-circuit includes: a second transistor M2. The second transistor M2 has a control electrode coupled to the second reset terminal RST2, a first electrode coupled to the pull-up control node H, and a second electrode coupled to the low-level voltage terminal VGL.

As another implementation of the second reset sub-circuit, as shown in FIGS. 5B to 5E and 5H, the second reset sub-circuit includes: a second transistor M2 and a thirteenth transistor M13.

In an embodiment, the second transistor M2 has a control electrode coupled to the second reset terminal RST2, a first electrode coupled to the pull-up control node H, and a second electrode coupled to the second feedback node OFF2. The thirteenth transistor M13 has a control electrode coupled to the second reset terminal RST2, a first electrode coupled to the second feedback node OFF2, and a second electrode coupled to the low-level voltage terminal VGL.

In the detection sub-shift register shown in FIGS. 5B to 5E and 5H, the second transistor M2 and the thirteenth transistor M13 are in a negative bias state for a long time, and leakage will occur when the signal of the pull-up control node H is at a high level, which in turn affects the output. In order to prevent leakage of a transistor in a negative bias state for a long time and ensure display effect, the detection sub-shift register further includes: a second leakage prevention sub-circuit.

In an embodiment, the second leakage prevention sub-circuit is coupled to the pull-up control node H, the high-level voltage terminal VA and the second feedback node OFF2, and configured to provide the signal of the high-level voltage terminal VA to the second feedback node OFF2 under the control of the pull-up control node H, to maintain the high level of the pull-up control node H.

In an embodiment, the second leakage prevention sub-circuit includes a fourteenth transistor M14, which has a control electrode coupled to the pull-up control node H, a first electrode coupled to the high-level voltage terminal VA, and a second electrode coupled to the second feedback node OFF2.

In the case where the detection sub-shift register includes the second leakage prevention sub-circuit, when the detection input sub-circuit includes the first transistor M1, the third transistor M3, and the twelfth transistor M12, the second feedback node OFF2 is further coupled to the second electrode of the first transistor M1. Such an example is shown in FIGS. 5B, 5E and 5H.

In the present embodiment, the second leakage prevention sub-circuit is further analyzed by taking FIG. 5B as an example. When the pull-up control node H is at a high level, the input signal of the second reset terminal RST2 is at a low level, and the second transistor M2 and the thirteenth transistor M13 are in a negative bias state for a long time. Since the pull-up control node H is at a high level, the fourteenth transistor M14 is turned on, and a signal of the high-level voltage terminal VA is provided to the second feedback node OFF2. Since the signal of the second feedback node OFF2 is at a high level, one of the gate-to-source voltage differences of the second transistor M2 and the thirteenth transistor M13 necessarily has a value less than zero, so that leakage will not occur in the second reset sub-circuit, the pull-up control node H maintains at a high level and the stability of the output is ensured. When the pull-up control node H is at a low level, the fourteenth transistor M14 is turned off, at this time, the second reset terminal RST2 is at a high level, and the voltage level of the second feedback node OFF2 is pulled down to the low level of the low-level voltage terminal VGL.

As shown in FIGS. 5A to 5H, the first control sub-circuit in the detection sub-shift register according to an embodiment of the present disclosure includes: a nineteenth transistor M19.

In an embodiment, the nineteenth transistor M19 has a control electrode coupled to the display control terminal SCANG, a first electrode coupled to the first pull-down node PD1, and a second electrode coupled to the low-level voltage terminal VGL.

The display control terminal SCANG is coupled to the cascade output terminal of the display sub-shift register (for example, the cascade output terminal CR in the drawings). When the output signal of the cascade output terminal is at a high level, that is, when the display sub-shift register has an output, the input signal of the display control terminal SCANG is at a high level, and the nineteenth transistor M19 is turned on to pull the voltage level of the first pull-down node PD1 down to the signal of the low-level voltage terminal VGL.

In some embodiments, in order to ensure output stability, the detection sub-shift register according to an embodiment of the present disclosure further includes: a storage sub-circuit.

In an embodiment, the storage sub-circuit is coupled to the pull-up control node H and the low-level voltage terminal VGL, respectively, and configured to store a voltage level difference between the pull-up control node H and the low-level voltage terminal VGL.

As shown in FIGS. 5A to 5E, the storage sub-circuit includes a first capacitor C1, which has a first end coupled to the pull-up control node H, and a second end coupled to the low-level voltage terminal VGL.

As another implementation, the storage sub-circuit is coupled to the second clock signal terminal CLK2 and the pull-up control node H, respectively, and configured to store a voltage level difference between the second clock signal terminal CLK2 and the pull-up control node H.

As shown in FIGS. 5F and 5H, the storage sub-circuit includes a first capacitor C1, which has a first end coupled to the pull-up control node H, and a second end coupled to the second clock signal terminal CLK2.

As still another implementation, the storage sub-circuit is coupled to the pull-up control node H and the high-level voltage terminal VA, respectively, and configured to store a voltage level difference between the pull-up control node H and the high-level voltage terminal VA.

As shown in FIG. 5G, the storage sub-circuit includes a first capacitor C1, which has a first end coupled to the pull-up control node H, and a second end coupled to the high-level voltage terminal VA.

In some embodiments, the embodiments of the present disclosure further include a clock control sub-circuit, which is coupled to the pull-up control node H, the second feedback node OFF2, and the second clock signal terminal CLK2, respectively, and configured to provide the signal of the second feedback node OFF2 to the second clock signal terminal CLK2 under the control of the pull-up control node H.

FIG. 5H shows an example of the clock control sub-circuit. In an embodiment, the clock control sub-circuit includes a twentieth transistor M20, which has a control electrode coupled to the pull-up control node H, a first electrode coupled to the second clock signal terminal CLK2, and a second electrode coupled to the second feedback node OFF2.

In the present embodiment, the transistors M1 to M20 may be all N-type thin film transistors, or may be all P-type thin film transistors. In this way, the process procedure can be unified, the process steps can be reduced, and the yield of the product can be improved. In addition, the embodiments of the present disclosure are described by taking a case where all transistors are oxide thin film transistors as an example, and the thin film transistors may be bottom-gate thin film transistors or top-gate thin film transistors as long as the transistors can function as a switch.

It should be noted that the capacitors C1 to C3 may be parasitic capacitances of the thin film transistors, and may also be external capacitors, which is not limited in the embodiments of the present disclosure.

Hereinafter, the technical solution of the embodiments of the present disclosure will be further illustrated through the operation process of the detection sub-shift register by taking FIG. 5A and FIG. 5B as examples, respectively.

Figure 6:
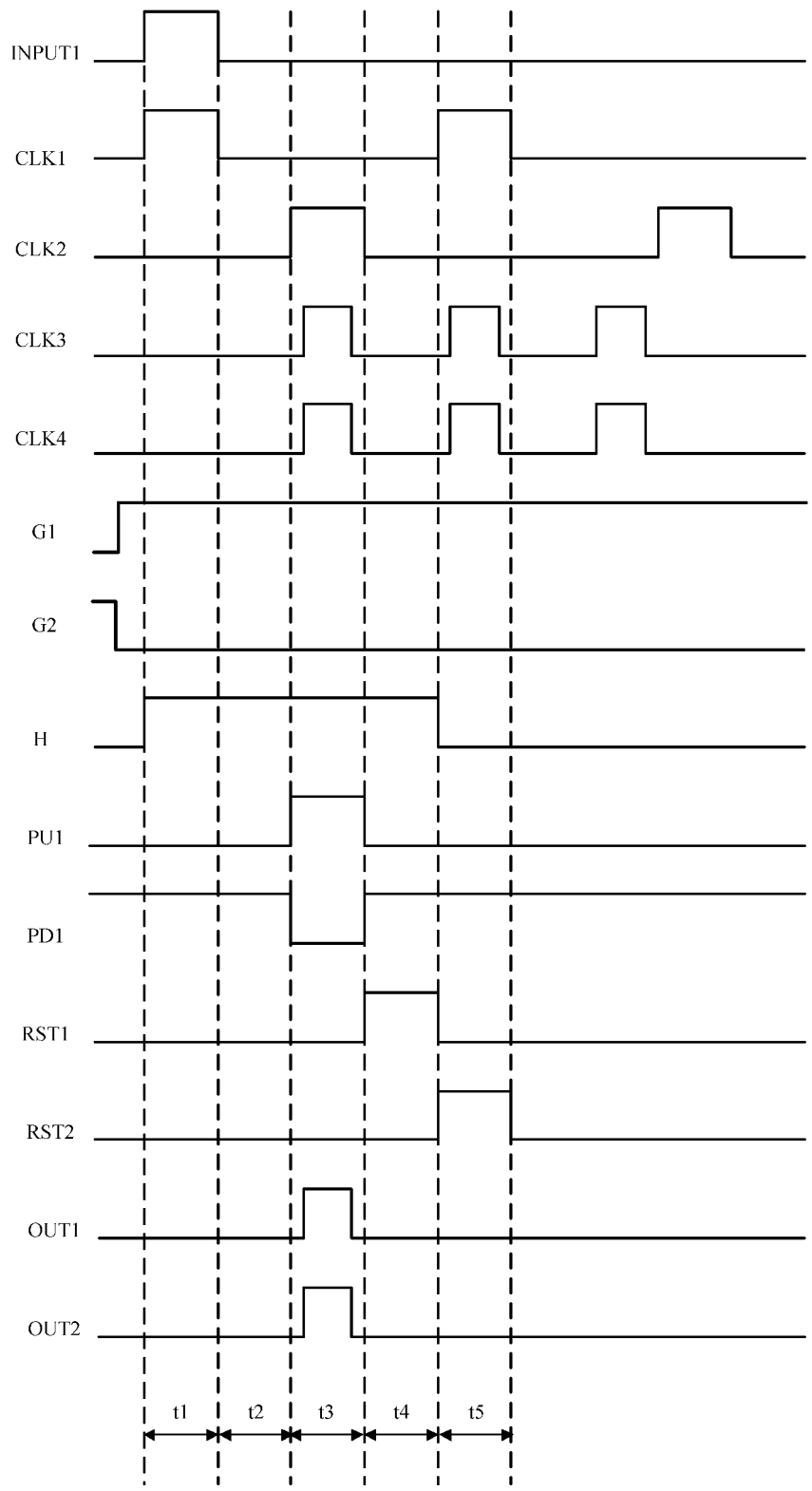
FIG. 6 is an operation timing diagram of a detection sub-shift register according to an embodiment of the present disclosure.

As an example, the transistors in the shift register according to the embodiments of the present disclosure are all N-type thin film transistors. FIG. 6 is an operation timing diagram of the detection sub-shift register according to an embodiment of the present disclosure. As shown in FIGS. 5A and 6, the detection sub-shift register according to an embodiment of the present disclosure includes twelve transistors (M1 to M11, and M19), one capacitor (C1), and ten signal input terminals (INPUT1, CLK1, CLK2, CLK3, CLK4, G1, G2, RST1 and RST2, and SCANG), two signal output terminals (OUT1 and OUT2), and one constant voltage terminal (VGL).

The low-level voltage terminal VGL continuously provides a low level. The level(s) of the off signal(s) provided to the first reset terminal RST1, the second reset terminal RST2, and the first clock signal terminal CLK1 is(are) lower than the level of the signal of the low-level voltage terminal VGL. The high levels of the signals of the first clock signal terminal CLK1 and the second clock signal terminal CLK2 are higher than the high levels of the signals of the third clock signal terminal CLK3 and the fourth clock signal terminal CLK4.

In a first stage t1, the input signal of the first clock signal terminal CLK1 is at a high level, the input signal of the first input terminal INPUT1 is at a high level, and the first transistor M1 is turned on to provide the input signal of the first input terminal INPUT1 to the pull-up control node H. At this time, the pull-up control node H is at a high level, the third transistor M3 is turned on, and the first capacitor C1 starts to be charged. Since the input signal of the second clock signal terminal CLK2 is at a low level, the first pull-up node PU1 is at a low level, the eighth transistor M8 and the ninth transistor M9 are turned off, and the first output terminal OUT1 and the second output terminal OUT2 have no output. In addition, the input signal of the first control terminal G1 is at a high level, the fifth transistor M5 is turned on, the level of the first pull-down node PD1 is pulled high, and the tenth transistor M10 and the eleventh transistor M11 are turned on to initialize the output signals of the first and second output terminals OUT1 and OUT2 to the low level of the low-level voltage terminal VGL.

In this stage, the input signals of the first clock signal terminal CLK1, the first input terminal INPUT1 and the first control terminal G1 are at a high level, the input signals of the second clock signal terminal CLK2, the third clock signal terminal CLK3, the fourth clock signal terminal CLK4, the first reset terminal RST1, the second reset terminal RST2, and the second control terminal G2 are at a low level, and the output signals of the first output terminal OUT1 and the second output terminal OUT2 are at a low level.

In a second stage t2, the input signal of the first clock signal terminal CLK1 is at a low level, the input signal of the first input terminal INPUT1 is at a low level, and the first transistor M1 is turned off. At this time, the first capacitor C1 causes the pull-up control node H to maintain the high level, and the third transistor M3 remains in the on state. However, since the input signal of the second clock signal terminal CLK2 is still at a low level, the first pull-up node PU1 is still at a low level, the eighth transistor M8 and the ninth transistor M9 are turned off, and the first output terminal OUT1 and the second output terminal OUT2 have no output. In addition, the input signal of the first control terminal G1 is at a high level, the fifth transistor M5 is turned on, the level of the first pull-down node PD1 is pulled high, and the tenth transistor M10 and the eleventh transistor M11 are turned on to provide the low level of the low-level voltage terminal VGL to the first output terminal OUT1 and the second output terminal OUT2 as output signals.

In this stage, the input signal of the first control terminal G1 is at a high level, the input signals of the first clock signal terminal CLK1, the first input terminal INPUT1, the second clock signal terminal CLK2, the third clock signal terminal CLK3, the fourth clock signal terminal CLK4, the first reset terminal RST1, the second reset terminal RST2 and the second control terminal G2 are all at a low level, and the output signals of the first output terminal OUT1 and the second output terminal OUT2 are at a low level.

In a third stage t3, the input signal of the second clock signal terminal CLK2 is at a high level, the third transistor M3 is turned on due to the high level of the pull-up control node H, such that the input signal of the second clock signal terminal CLK2 is provided to the first pull-up node PU1. At this time, the first pull-up node PU1 is at a high level, and the eighth transistor M8 and the ninth transistor M9 are turned on. The input signals of the third clock signal terminal CLK3 and the fourth clock signal terminal CLK4 are at a high level, the input signal of the third clock terminal CLK3 is provided to the first output terminal OUT1, and the input signal of the fourth clock signal terminal CLK4 is provided to the second output terminal OUT2. Since the first pull-up node PU1 is at a high level, the sixth transistor M6 is turned on, the level of the first pull-down node PD1 is pulled down to the low level of the low-level voltage terminal VGL, and the tenth transistor M10 and the eleventh transistor M11 are turned off, so the output signals of the first output terminal OUT1 and the second output terminal OUT2 are not pulled low.

In this stage, the input signals of the second clock signal terminal CLK2, the third clock signal terminal CLK3, the fourth clock signal terminal CLK4, and the first control terminal G1 are at a high level, and the input signals of the first clock signal terminal CLK1, the first input terminal INPUT1, the first reset terminal RST1, the second reset terminal RST2 and the second control terminal G2 are all at a low level, and the output signals of the first output terminal OUT1 and the second output terminal OUT2 are at a high level.

In a fourth stage t4, the input signal of the first reset terminal RST1 is at a high level, the fourth transistor M4 is turned on, the level of the first pull-up node PU1 is pulled down to the low level of the low-level voltage terminal VGL to reduce noise, and the sixth transistor M6, the eighth transistor M8, and the ninth transistor M9 are turned off. Since the input signal of the first control terminal G1 is at a high level, the fifth transistor M5 is turned on, and the level of the first pull-down node PD1 is pulled up to the high level of the first control terminal G1, so the tenth transistor M10 and the eleventh transistor M11 are turned on, and the output signals of the first output terminal OUT1 and the second output terminal OUT2 are pulled down to the low level of the low voltage terminal VGL to reduce noise.

In this stage, the input signals of the first reset terminal RST1 and the first control terminal G1 are at a high level, the input signals of the first clock signal terminal CLK1, the second clock signal terminal CLK2, the third clock signal terminal CLK3, the fourth clock signal terminal CLK4, the first input terminal INPUT1, the second reset terminal RST2, and the second control terminal G2 are all at a low level, and the output signals of the first output terminal OUT1 and the second output terminal OUT2 are at a low level.

In a fifth stage t5, the input signal of the second reset terminal RST2 is at a high level, the second transistor M2 is turned on, and the level of the pull-up control node H is pulled down to the low level of the low-level voltage terminal VGL to reduce noise. The input signals of the first clock signal terminal CLK1, the third clock signal terminal CLK3, and the fourth clock signal terminal CLK4 are at a high level, but since the level of the pull-up control node H is pulled low, the third transistor M3 is turned off, the first pull-up node PU1 is still at a low level, the eighth transistor T8 and the ninth transistor T9 remain in the off state, and the output signals of the first output terminal OUT1 and the second output terminal OUT2 are still at a low level. Since the input signal of the first control terminal G1 is at a high level, the fifth transistor M5 is turned on, the level of the first pull-down node PD1 is pulled up to the high level of the first control terminal G1, and the tenth transistor M10 and the eleventh transistor M11 are turned on to provide the low level of the low-level voltage terminal VGL to the first output terminal OUT1 and the second output terminal OUT2 to reduce noise.

In this stage, the input signals of the first clock signal terminal CLK1, the third clock signal terminal CLK3, the fourth clock signal terminal CLK4, the second reset terminal RST2, and the first control terminal G1 are at a high level, and the input signals of the second clock signal terminal CLK2, the first input terminal INPUT1, the first reset terminal RST1, and the second control terminal G2 are all at a low level, and the output signals of the first output terminal OUT1 and the second output terminal OUT2 are at a low level.

As an example, the transistors in the detection sub-shift register according to the embodiments of the present disclosure are all N-type thin film transistors. As shown in FIGS. 5B and 6, the shift register according to an embodiment of the present disclosure includes nineteen transistors (M1 to M19), one capacitor (C1), and ten signal input terminals (INPUT1, CLK1, CLK2, CLK3, CLK4, G1, G2, RST1 and RST2, and SCANG), two signal output terminals (OUT1 and OUT2), and two constant voltage terminals (VGL and VA).

The low-level voltage terminal VGL continuously provides a low-level signal, and the high-level voltage terminal VA continuously provides a high-level signal. The level(s) of the off signal(s) provided to the first reset terminal RST1, the second reset terminal RST2, and the first clock signal terminal CLK1 is (are) lower than the level of the signal of the low-level voltage terminal VGL. The high levels of the signals of the first clock signal terminal CLK1 and the second clock signal terminal CLK2 are higher than the high levels of the signals of the third clock signal terminal CLK3 and the fourth clock signal terminal CLK4.

In the first stage t1, the input signal of the first clock signal terminal CLK1 is at a high level, the input signal of the first input terminal INPUT1 is at a high level, and the first transistor M1 and the twelfth transistor M12 are turned on to provide the input signal of the first input terminal INPUT1 to the pull-up control node H and the second feedback node OFF2. At this time, the pull-up control node H is at a high level, the third transistor M3 and the fourteenth transistor M14 are turned on, and the first capacitor C1 starts to be charged. The input signal of the high-level voltage terminal VA is at a high level, and the level of the second feedback node OFF2 is pulled up to the high level of the high-level voltage terminal VA through the fourteenth transistor M14, so that at least one of the gate-to-source voltage differences of the second transistor M2 and the thirteenth transistor M13 is lower than 0, ensuring that no leakage will occur in the path of the second transistor M2 and the thirteenth transistor M13, and maintaining the high level of the pull-up control node H. Since the input signal of the second clock signal terminal CLK2 is at a low level, the level of the first pull-up node PU1 is low, the eighth transistor M8 and the ninth transistor M9 are turned off, and the first output terminal OUT1 and the second output terminal OUT2 have no output. In addition, the input signal of the first control terminal G1 is at a high level, the fifth transistor M5 is turned on, the level of the first pull-down node PD1 is pulled high, and the tenth transistor M10 and the eleventh transistor M11 are turned on to initialize the output signals of the first and second output terminals OUT1 and OUT2 to the low level of the low-level voltage terminal VGL. The sixteenth transistor M16 and the seventeenth transistor M17 are turned on to pull down the first pull-up node PU1 and the first feedback node OFF1 to the low level of the low-level voltage terminal. Since the signal of the first pull-up node PU1 is at a low level, the first feedback node OFF1 will not be pulled high through the fourth transistor M4.

In this stage, the input signals of the first clock signal terminal CLK1, the first input terminal INPUT1 and the first control terminal G1 are at a high level, the input signals of the second clock signal terminal CLK2, the third clock signal terminal CLK3, the fourth clock signal terminal CLK4, the first reset terminal RST1, the second reset terminal RST2, and the second control terminal G2 are at a low level, and the output signals of the first output terminal OUT1 and the second output terminal OUT2 are at a low level.

In the second stage t2, the input signal of the first clock signal terminal CLK1 is at a low level, the input signal of the first input terminal INPUT1 is at a low level, and the first transistor M1 and the twelfth transistor M12 are turned off. At this time, the first capacitor C1 causes the pull-up control node H to maintain the high level, the third transistor M3 remains in an on state, and the fourteenth transistor M14 remains in an on state. The input signal of the high-level voltage terminal VA is at a high level, and the level of the second feedback node OFF2 is pulled up to the high level of the high-level voltage terminal VA, so that at least one of the gate-to-source voltage differences of the second transistor M2 and the thirteenth transistor M13 is lower than 0, ensuring that no leakage will occur in the path of the second transistor M2 and the thirteenth transistor M13, and maintaining the high level of the pull-up control node H. However, since the input signal of the second clock signal terminal CLK2 is still at a low level, the first pull-up node PU1 is still at a low level, the eighth transistor M8 and the ninth transistor M9 are turned off, and the first output terminal OUT1 and the second output terminal OUT2 have no output. In addition, the input signal of the first control terminal G1 is at a high level, the fifth transistor M5 is turned on, the level of the first pull-down node PD1 is pulled high, and the tenth transistor M10 and the eleventh transistor M11 are turned on to provide the low-level signal of the low-level voltage terminal VGL to the first output terminal OUT1 and the second output terminal OUT2 as output signals. Under the control of the high level of the first pull-down node PD1, the sixteenth transistor M16 and the seventeenth transistor M17 are turned on to pull the first pull-up node PU1 and the first feedback node OFF1 down to the low level of the low-level voltage terminal VGL. Since the signal of the first pull-up node PU1 is at a low level, the first feedback node OFF1 will not be pulled high.

In this stage, the input signal of the first control terminal G1 is at a high level, the input signals of the first clock signal terminal CLK1, the first input terminal INPUT1, the second clock signal terminal CLK2, the third clock signal terminal CLK3, the fourth clock signal terminal CLK4, the first reset terminal RST1, the second reset terminal RST2 and the second control terminal G2 are all at a low level, and the output signals of the first output terminal OUT1 and the second output terminal OUT2 are at a low level.

In the third stage t3, the input signal of the second clock signal terminal CLK2 is at a high level, the third transistor M3 is turned on due to the high level of the pull-up control node H, such that the input signal of the second clock signal terminal CLK2 is provided to the first pull-up node PU1. At this time, the first pull-up node PU1 is at a high level, and the eighth transistor M8 and the ninth transistor M9 are turned on. The input signals of the third clock signal terminal CLK3 and the fourth clock signal terminal CLK4 are at a high level, the input signal of the third clock terminal CLK3 is provided to the first output terminal OUT1, and the input signal of the fourth clock signal terminal CLK4 is provided to the second output terminal OUT2. Since the first pull-up node PU1 is at a high level, the sixth transistor M6 and the eighteenth transistor M18 are turned on, the level of the first pull-down node PD1 is pulled down to the low level of the low-level voltage terminal VGL, and the tenth transistor M10, the eleventh transistor M11, the sixteenth transistor M16 and the seventeenth transistor M17 are turned off, so the output signals of the first output terminal OUT1 and the second output terminal OUT2 are not pulled low. The level of the second feedback node OFF2 is pulled up to the high level of the high-level voltage terminal VA through the eighteenth transistor M18, so that at least one of the gate-to-source voltage differences of the fourth transistor M4 and the fifteenth transistor M15 is lower than 0, ensuring that no leakage will occur in the path of the fourth transistor M4 and the fifteenth transistor M15. In addition, although the input signal of the first control terminal G1 is at a high level, since the sixth transistor M6 is turned on to continuously provide the low-level signal of the low-level voltage terminal VGL to the first pull-down node PD1, the level of the first pull-down node PD1 is low, so that the first output terminal OUT1 and the second output terminal OUT2 normally output their output signals.

In this stage, the input signals of the second clock signal terminal CLK2, the third clock signal terminal CLK3, the fourth clock signal terminal CLK4, and the first control terminal G1 are at a high level, and the input signals of the first clock signal terminal CLK1, the first input terminal INPUT1, the first reset terminal RST1, the second reset terminal RST2 and the second control terminal G2 are all at a low level, and the output signals of the first output terminal OUT1 and the second output terminal OUT2 are at a high level.

In the fourth stage t4, the input signal of the first reset terminal RST1 is at a high level, the fourth transistor M4 and the fifteenth transistor M15 are turned on, the level of the first pull-up node PU1 is pulled down to the low level of the low-level voltage terminal VGL to reduce noise. Since the first pull-up node PU1 is at a low level, the sixth transistor M6, the eighth transistor M8, the ninth transistor M9, and the eighteenth transistor M18 are turned off. Since the input signal of the first control terminal G1 is at a high level, the fifth transistor M5 is turned on, and the level of the first pull-down node PD1 is pulled up to the high level of the first control terminal G1, so the tenth transistor M10 and the eleventh transistor M11 are turned on, and the first output terminal OUT1 and the second output terminal OUT2 are pulled down to the low level of the low voltage terminal VGL to reduce noise. The sixteenth transistor M16 and the seventeenth transistor M17 are turned on to provide the low level of the low-level voltage terminal VGL to the first pull-up node PU1.

In this stage, the input signals of the first reset terminal RST1 and the first control terminal G1 are at a high level, the input signals of the first clock signal terminal CLK1, the second clock signal terminal CLK2, the third clock signal terminal CLK3, the fourth clock signal terminal CLK4, the first input terminal INPUT1, the second reset terminal RST2, and the second control terminal G2 are all at a low level, and the output signals of the first output terminal OUT1 and the second output terminal OUT2 are at a low level.

In the fifth stage t5, the input signal of the second reset terminal RST2 is at a high level, the second transistor M2 and the thirteenth transistor M13 are turned on, and the levels of the pull-up control node H and the second feedback node OFF2 are pulled down to the low level of the low-level voltage terminal VGL, and the fourteenth transistor M14 is turned off to reduce noise. The input signals of the first clock signal terminal CLK1, the third clock signal terminal CLK3, and the fourth clock signal terminal CLK4 are at a high level, but since the level of the pull-up control node H is pulled low, the third transistor M3 is turned off, the first pull-up node PU1 is still at a low level, and the eighth transistor T8 and the ninth transistor T9 remain in the off state, and the output signals of the first output terminal OUT1 and the second output terminal OUT2 are still at a low level. Since the input signal of the first control terminal G1 is at a high level, the fifth transistor M5 is turned on, the level of the first pull-down node PD1 is pulled up to the high level of the first control terminal G1, and the tenth transistor M10, the eleventh transistor M11, the sixteenth transistor M16 and the seventeenth transistor M17 are turned on to provide the low level of the low-level voltage terminal VGL to the first and second output terminals OUT1 and OUT2 and the first pull-up node PU1 to reduce noise.

In this stage, the input signals of the first clock signal terminal CLK1, the third clock signal terminal CLK3, the fourth clock signal terminal CLK4, the second reset terminal RST2, and the first control terminal G1 are at a high level, and the input signals of the second clock signal terminal CLK2, the first input terminal INPUT1, the first reset terminal RST1, and the second control terminal G2 are all at a low level, and the output signals of the first output terminal OUT1 and the second output terminal OUT2 are at a low level.

In addition, the operation principles of the detection sub-shift registers shown in FIGS. 5C to 5H are similar to those of FIGS. 5A and 5B, and details thereof are not described herein again.

Figure 7:
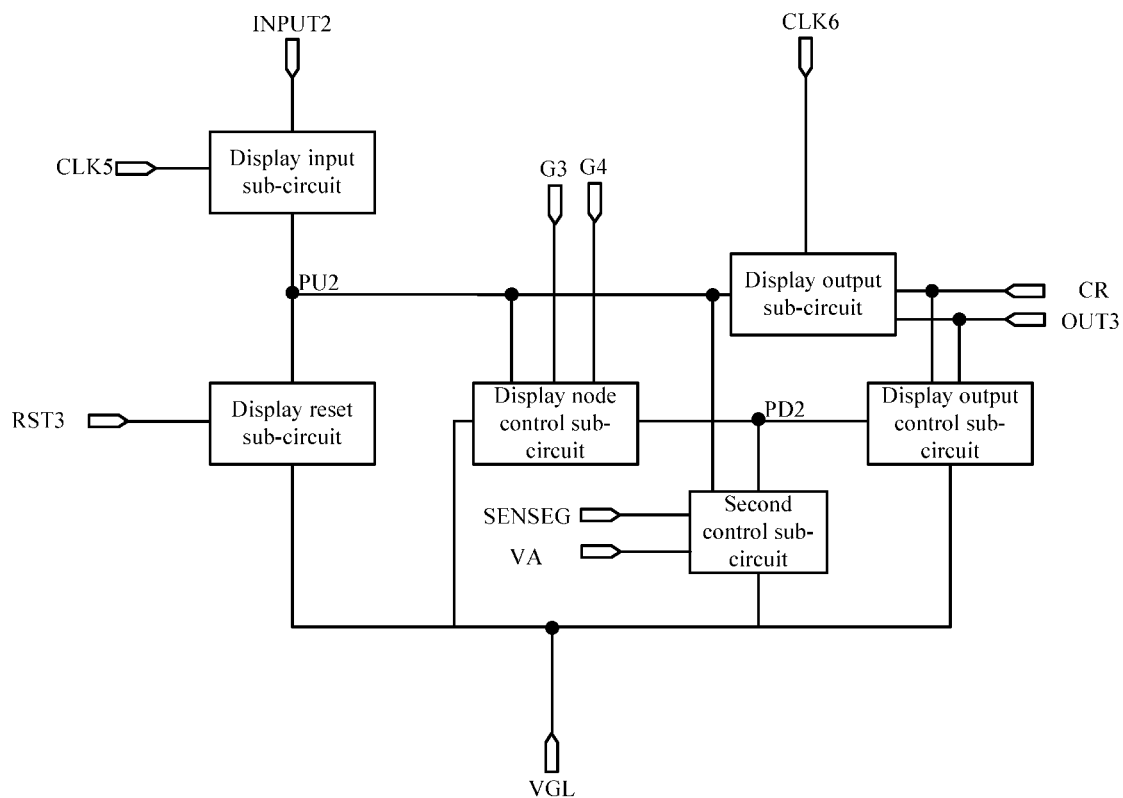
FIG. 7 is a structural schematic diagram of a display sub-shift register according to an embodiment of the present disclosure.

FIG. 7 is a structural schematic diagram of a display sub-shift register according to an embodiment of the present disclosure. As shown in FIG. 7, the display sub-shift register according to an embodiment of the present disclosure includes: a display input sub-circuit, a display output sub-circuit, a display reset sub-circuit, a display output control sub-circuit, and a display node control sub-circuit.

In an embodiment, the display input sub-circuit is coupled to a second input terminal INPUT2, a fifth clock signal terminal CLK5, and a second pull-up node PU2, and configured to provide a signal of the second input terminal INPUT2 to the second pull-up node PU2 under the control of the fifth clock signal terminal CLK5. The display output sub-circuit is coupled to a sixth clock signal terminal CLK6, the second pull-up node PU2, the cascade output terminal CR, and a third output terminal OUT3, and configured to provide a signal of the sixth clock signal terminal CLK6 to the cascade output terminal CR and the third output terminal OUT3 under the control of the second pull-up node PU2. The display reset sub-circuit is coupled to the third reset terminal RST3, the second pull-up node PU2 and the low-level voltage terminal VGL, and configured to provide the signal of the low-level voltage terminal VGL to the second pull-up node PU2 under the control of the third reset terminal RST3. The display output control sub-circuit is coupled to the cascade output terminal CR, the third output terminal OUT3, a second pull-down node PD2, and the low-level voltage terminal VGL, and configured to provide the signal of the low-level voltage terminal VGL to the cascade output terminal CR and the third output terminal OUT3 under the control of the second pull-down node PD2. The display node control sub-circuit is coupled to a third control terminal G3, a fourth control terminal G4, the second pull-up node PU2, the second pull-down node PD2, and the low-level voltage terminal VGL, and configured to provide the signal of the low-level voltage terminal VGL to the second pull-down node PD2 under the control of the third control terminal G3, the fourth control terminal G4, and the second pull-up node PU2.

When the display sub-shift register is used in conjunction with the detection sub-shift register described herein, the display control terminal SCANG of the detection sub-shift register is coupled to the cascade output terminal CR of the display sub-shift register.

It should be noted that the display sub-shift register may further include a plurality of output terminals for driving a plurality of gate lines, and FIG. 7 illustrates an example in which the display sub-shift register includes one output terminal (i.e., a third output terminal) for driving one gate line. When the display sub-shift register includes N output terminals for driving N gate lines, the display output sub-circuit is configured to provide a signal of the sixth clock signal terminal CLK6 to the N output terminals under the control of the second pull-up node PU2, and correspondingly, the display output control sub-circuit is configured to provide the low level of the low-level voltage terminal VGL to the N output terminals under the control of the second pull-down node PD2.

In some embodiments, the signals of the third control terminal G3 and the fourth control terminal G4 may be alternate DC high-level signals (that is, when one of the signals of the third control terminal G3 and the fourth control terminal G4 is at a high level, the other one is at a low level). Alternatively, they may be alternate low frequency clock signals, and the periods of the signals of the third control terminal G3 and the fourth control terminal G4 are longer than an operation period of the shift register. That is, in one operation cycle, one of the third control terminal G3 and the fourth control terminal G4 is constantly at a high level, which is not limited in the embodiments of the present disclosure. It should be noted that the third control terminal G3 and the fourth control terminal G4 may also be one and the same signal terminal, which is not limited in the embodiments of the disclosure. When the third control terminal G3 and the fourth control terminal G4 are one and the same signal terminal (for example, referred to as a control signal terminal), the display node control sub-circuit may be configured to provide the signal of the low-level voltage terminal VGL to the second pull-down node PD2 under the control of the one signal terminal (e.g., the control signal terminal) and the second pull-up node PU2.

In addition, as shown in FIG. 7, the display sub-shift register according to an embodiment of the present disclosure further includes a second control sub-circuit, which is coupled to the second pull-up node PU2, the second pull-down node PD2, the detection control terminal SENSEG, and the high-level voltage terminal VA and the low-level voltage terminal VGL, and configured to provide the signal of the low-level voltage terminal VGL to the second pull-up node PU2 and the second pull-down node PD2 under the control of the detection control terminal SENSEG.

When the display sub-shift register is used in conjunction with the detection sub-shift register described herein, the detection control terminal SENSEG of the display sub-shift register is coupled to the first pull-up node PU1 of the detection sub-shift register.

It is to be noted that although FIG. 7 shows a case where the display sub-shift register includes the second control sub-circuit, the present disclosure is not limited thereto. The display sub-shift register according to an embodiment of the present disclosure may not include the second control sub-circuit.

Figure 8:
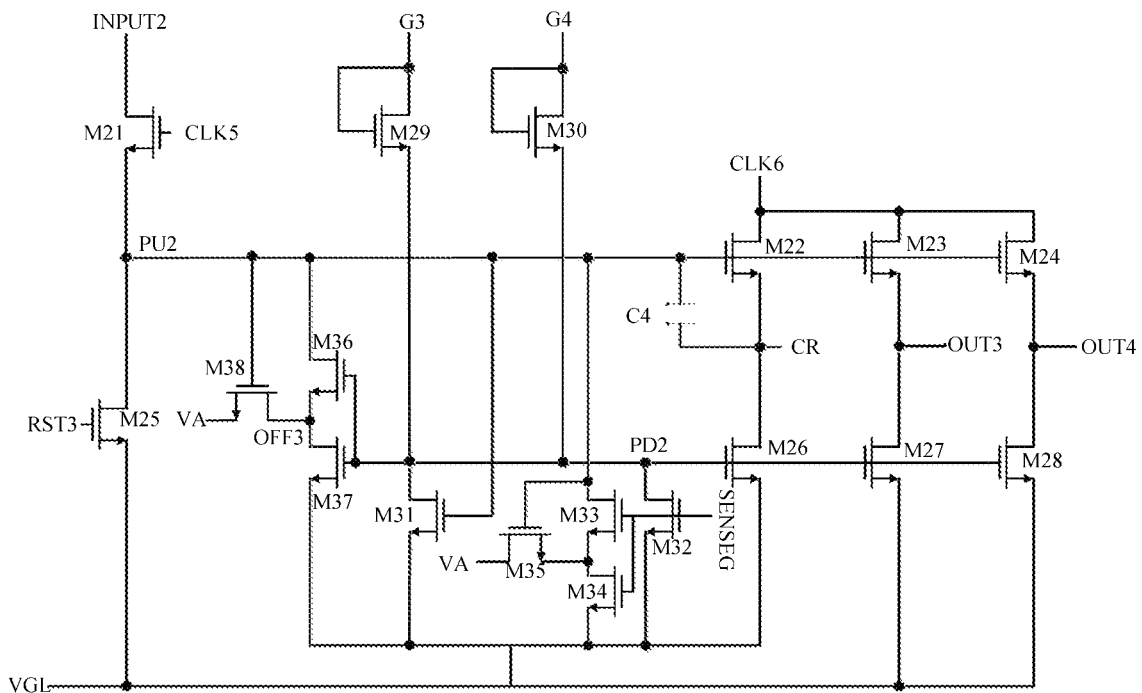
FIG. 8 is a circuit diagram of a display sub-shift register according to an embodiment of the present disclosure.

FIG. 8 is a circuit diagram of the display sub-shift register according to an embodiment of the present disclosure. As shown in FIG. 8, the display input sub-circuit in the display sub-shift register according to an embodiment of the present disclosure includes: a twenty-first transistor M21.

In an embodiment, the twenty-first transistor M21 has a control electrode coupled to the fifth clock signal terminal CLK5, a first electrode coupled to the second input terminal INPUT2, and a second electrode coupled to the second pull-up node PU2.

In the present embodiment, an exemplary structure of the display input sub-circuit is shown in FIG. 8. It will be readily understood by those skilled in the art that the implementation of the display input sub-circuit is not limited thereto as long as its function can be realized.

As shown in FIG. 8, the display output sub-circuit in the display sub-shift register according to an embodiment of the present disclosure includes: a twenty-second transistor M22, a twenty-third transistor M23, a twenty-fourth transistor M24, and a fourth capacitor C4.

In an embodiment, the twenty-second transistor M22 has a control electrode coupled to the second pull-up node PU2, a first electrode coupled to the sixth clock signal terminal CLK6, and a second electrode coupled to the cascade output terminal CR. The twenty-third transistor M23 has a control electrode coupled to the second pull-up node PU2, a first electrode coupled to the sixth clock signal terminal CLK6, and a second electrode coupled to the third output terminal OUT3. The twenty-fourth transistor M24 has a control electrode coupled to the second pull-up node PU2, a first electrode coupled to the sixth clock signal terminal CLK6, and a second electrode coupled to the fourth output terminal OUT4. The fourth capacitor C4 has a first end coupled to the second pull-up node PU2, and a second end coupled to the cascade output terminal CR.

In the present embodiment, an exemplary structure of the display output sub-circuit is shown in FIG. 8. It will be readily understood by those skilled in the art that the implementation of the display output sub-circuit is not limited thereto as long as its function can be realized.

As shown in FIG. 8, the display reset sub-circuit in the display sub-shift register according to an embodiment of the present disclosure includes: a twenty-fifth transistor M25.

In an embodiment, the twenty-fifth transistor M25 has a control electrode coupled to the third reset terminal RST3, a first electrode coupled to the second pull-up node PU2, and a second electrode coupled to the low-level voltage terminal VGL.

In the present embodiment, an exemplary structure of the display reset sub-circuit is shown in FIG. 8. It will be readily understood by those skilled in the art that the implementation of the display reset sub-circuit is not limited thereto as long as its function can be realized.

As shown in FIG. 8, the display output control sub-circuit in the display sub-shift register according to an embodiment of the present disclosure includes: a twenty-sixth transistor M26, a twenty-seventh transistor M27, and a twenty-eighth transistor M28.

In an embodiment, the twenty-sixth transistor M26 has a control electrode coupled to the second pull-down node PD2, a first electrode coupled to the cascade output terminal CR, and a second electrode coupled to the low-level voltage terminal VGL. The twenty-seventh transistor M27 has a control electrode coupled to the second pull-down node PD2, a first electrode coupled to the third output terminal OUT3, and a second electrode coupled to the low-level voltage terminal VGL. The twenty-eighth transistor M28 has a control electrode coupled to the second pull-down node PD2, a first electrode coupled to the fourth output terminal OUT4, and a second electrode coupled to the low-level voltage terminal VGL.

In the present embodiment, an exemplary structure of the display output control sub-circuit is shown in FIG. 8. It will be readily understood by those skilled in the art that the implementation of the display output control sub-circuit is not limited thereto as long as its function can be realized.

FIG. 8 shows an example in which the display sub-shift register includes two output terminals (the third output terminal OUT3 and the fourth output terminal OUT4) for driving two gate lines. The display output sub-circuit in FIG. 8 provides the signal of the sixth clock signal terminal CLK6 to the third output terminal OUT3 and the fourth output terminal OUT4, respectively, under the control of the second pull-up node PU2. The display output control sub-circuit in FIG. 8 provides the low level of the low-level voltage terminal VGL to the third output terminal OUT3 and the fourth output terminal OUT4, respectively, under the control of the second pull-down node PD2. It should be noted that the present disclosure is not limited thereto, and the circuit shown in FIG. 8 may also be modified such that the display output sub-circuit drives one gate line. In this case, the twenty-fourth transistor M24 of the display output sub-circuit and the twenty-eighth transistor M28 of the display output control sub-circuit may be excluded.

As shown in FIG. 8, the display node control sub-circuit in the display sub-shift register according to an embodiment of the present disclosure includes: a twenty-ninth transistor M29, a thirtieth transistor M30, and a thirty-first transistor M31.

In an embodiment, the twenty-ninth transistor M29 has a control electrode and a first electrode both coupled to the third control terminal G3, and a second electrode coupled to a first electrode of the thirty-first transistor M31. The thirtieth transistor M30 has a control electrode and a first electrode both coupled to the fourth control terminal G4, and a second electrode coupled to the second pull-down node PD2. The thirty-first transistor M31 has a control electrode coupled to the second pull-up node PU2, a first electrode coupled to the second pull-down node PD2, and a second electrode coupled to the low-level voltage terminal VGL.

In an embodiment, a width-to-length ratio of the thirty-first transistor M31 is greater than a width-to-length ratio of the twenty-ninth transistor M29 or the thirtieth transistor M30.

In the present embodiment, an exemplary structure of the display node control sub-circuit is shown in FIG. 8. It will be readily understood by those skilled in the art that the implementation of the display node control sub-circuit is not limited thereto as long as its function can be realized.

As shown in FIG. 8, the second control sub-circuit in the display sub-shift register according to an embodiment of the present disclosure includes: a thirty-second transistor M32, a thirty-third transistor M33, a thirty-fourth transistor M34, and a thirty-fifth transistors M35.

In an embodiment, the thirty-second transistor M32 has a control electrode coupled to the detection control terminal SENSEG, a first electrode coupled to the second pull-down node PD2, and a second electrode coupled to the low-level voltage terminal VGL. The thirty-third transistor M33 has a control electrode coupled to the detection control terminal SENSEG, a first electrode coupled to the second pull-up node PU2, and a second electrode coupled to a first electrode of the thirty-fourth transistor M34. The thirty-fourth transistor M34 has a control electrode coupled to the detection control terminal SENSEG, and a second electrode coupled to the low-level voltage terminal VGL. The thirty-fifth transistor M35 has a control electrode coupled to the second pull-up node PU2, a first electrode coupled to the second electrode of the thirty-third transistor M33, and a second electrode coupled to the high-level voltage terminal VA.

In the present embodiment, an exemplary structure of the second control sub-circuit is shown in FIG. 8. It will be readily understood by those skilled in the art that the implementation of the second control sub-circuit is not limited thereto as long as its function can be realized.

In some embodiments, the display sub-shift register according to an embodiment of the present disclosure further includes a third leakage prevention sub-circuit, which is coupled to the second pull-down node PD2, the second pull-up node PU2, the high-level voltage terminal VA, and the low-level voltage terminal VGL, and configured to provide the signal of the high-level voltage terminal VA to the third feedback node OFF3 under the control of the second pull-up node PU2, and provide the signal of the low-level voltage terminal VGL to the second pull-up node PU2 under the control of the second pull-down node PD2.

In some embodiments, as shown in FIG. 8, the third leakage prevention sub-circuit includes: a thirty-sixth transistor M36, a thirty-seventh transistor M37, and a thirty-eighth transistor M38.

In an embodiment, the thirty-sixth transistor M36 has a control electrode coupled to the second pull-down node PD2, a first electrode coupled to the second pull-up node PU2, and a second electrode coupled to the third feedback node OFF3. The thirty-seventh transistor M37 has a control electrode coupled to the second pull-down node PD2, a first electrode coupled to the third feedback node OFF3, and a second electrode coupled to the low-level voltage terminal VGL. The thirty-eighth transistor M38 has a control electrode coupled to the second pull-up node PU2, a first electrode coupled to the third feedback node OFF3, and a second electrode coupled to the high-level voltage terminal VA.

In the present embodiment, the transistors M21 to M38 may be all N-type thin film transistors, or may be all P-type thin film transistors. In this way, the process procedure can be unified, the process steps can be reduced, and the yield of the product can be improved. In addition, considering that a low temperature polysilicon thin film transistor has a small leakage current, all the transistors of the embodiments of the present disclosure may be low temperature polysilicon thin film transistors, and the thin film transistors may be bottom-gate thin film transistors or top-gate thin film transistors as long as the transistors can function as a switch.

Figure 9:
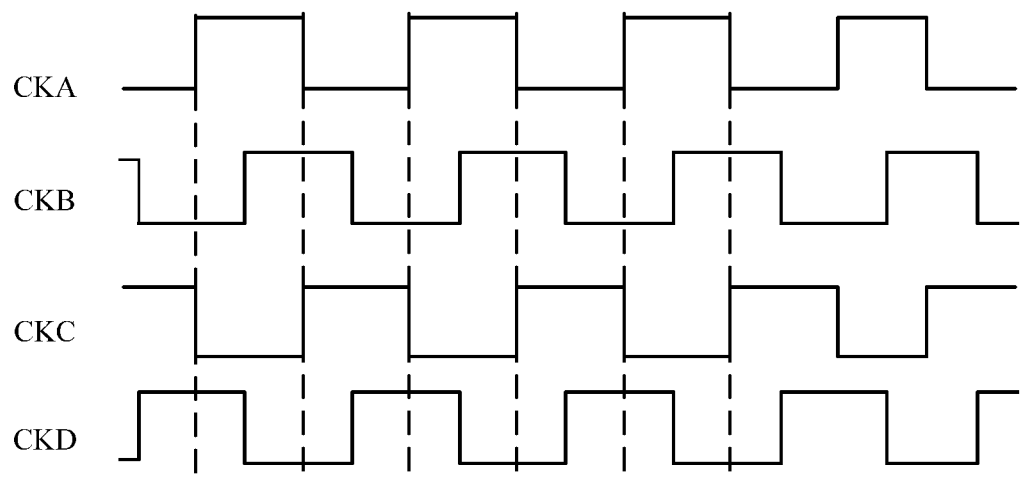
FIG. 9 is a schematic diagram for illustrating a timing of clock signals according to an embodiment of the present disclosure.

It should be noted that when the shift registers each including the above display sub-shift register are cascaded into a GOA circuit, the fifth clock signal terminals CLK5 and the sixth clock signal terminals CLK6 of adjacent two stages of shift registers may adopt different signals. In some embodiments, the signal of the fifth clock signal terminal CLK5 of the next stage of shift register may be delayed by one quarter period from the signal of the fifth clock signal terminal CLK5 of the current stage of shift register, and the signal of the sixth clock signal terminal CLK6 of the next stage of shift register may be delayed by one quarter period from the signal of the sixth clock signal terminal CLK6 of the current stage of shift register, and the fifth clock signal terminal CLK5 and the sixth clock signal terminal CLK6 of one stage of shift register have complementary clock signals. FIG. 9 shows an example of signals provided to the fifth clock signal terminal CLK5 and the sixth clock signal terminal CLK6 of each stage of shift register. In FIG. 9, four clock signals CKA, CKB, CKC, and CKD are sequentially triggered, a time period during which the clock signal CKA is at a high level and a time period during which the clock signal CKB is at a high level are partially overlapped, the time period during which the clock signal CKB is at a high level and a time period during which the clock signal CKC is at a high level are partially overlapped, the time period during which the clock signal CKC is at a high level and a time period during which the clock signal CKD is at a high level are partially overlapped, and the time period during which the clock signal CKD is at a high level and the time period during which the clock signal CKA is at a high level are partially overlapped. In the GOA circuit, the first gate line may be triggered by the clock signals CKA and CKC, the second gate line may be triggered by the clock signals CKB and CKD, the third gate line may be triggered by the clock signals CKC and CKA, and the fourth gate line may be triggered by the clock signals CKD and CKB, so on and so forth.

Hereinafter, the technical solution of the embodiments of the present disclosure will be further illustrated through the operation process of the display sub-shift register.

Figure 10:
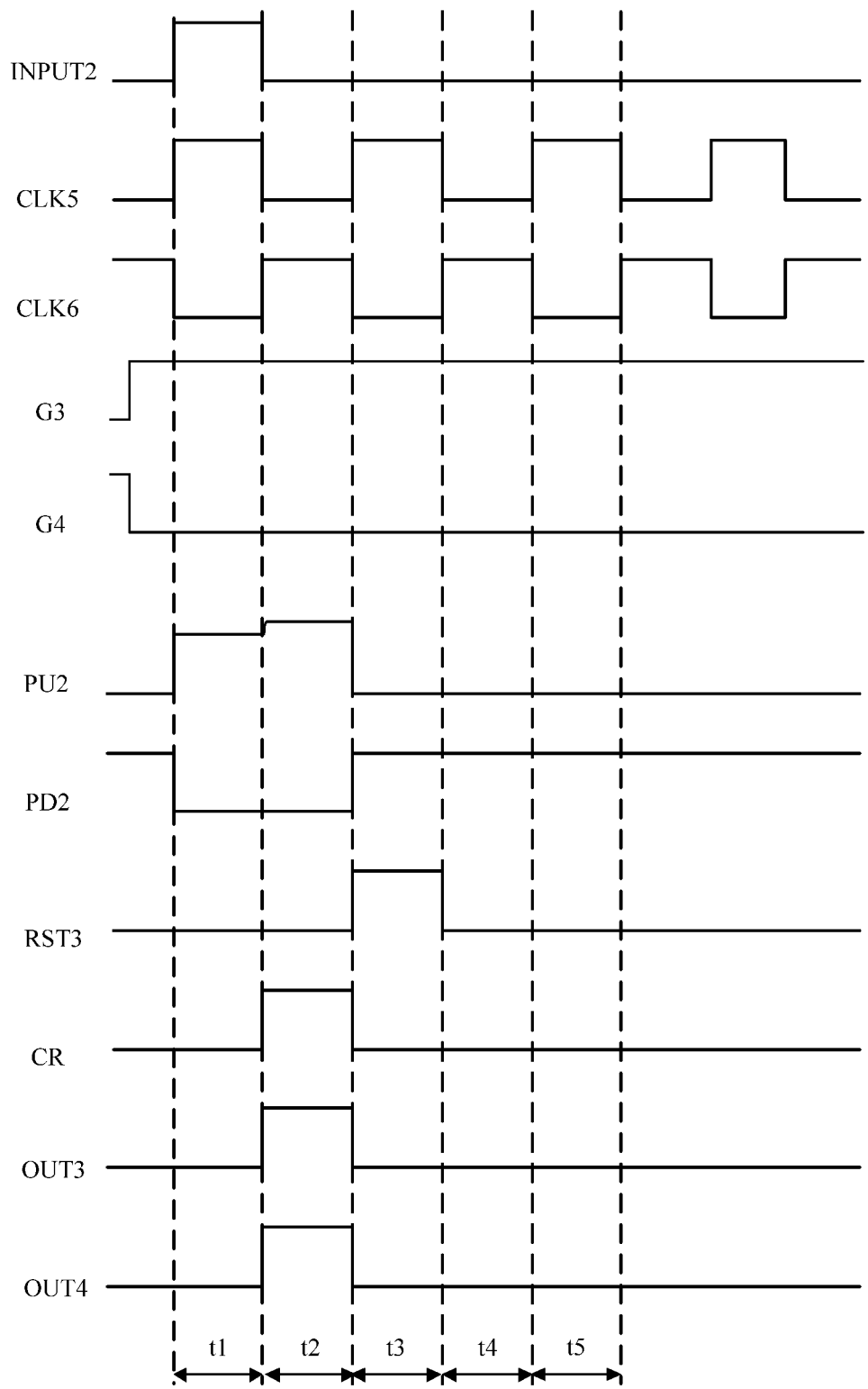
FIG. 10 is an operation timing diagram of a display sub-shift register according to an embodiment of the present disclosure.

As an example, the transistors M21 to M38 in the display sub-shift register according to the embodiments of the present disclosure are all N-type thin film transistors. FIG. 10 is an operation timing diagram of the display sub-shift register according to an embodiment of the present disclosure. As shown in FIGS. 8 and 10, the display sub-shift register according to an embodiment of the present disclosure includes eighteen transistors (M21 to M38), one capacitor (C4), and seven signal input terminals (INPUT2, G3, G4, CLK5, CLK6, RST3, and SENSEG), three signal output terminals (CR, OUT3 and OUT4), and two constant voltage terminals (VA and VGL).

In an embodiment, the high-level voltage terminal VA continuously provides a high-level signal, and the low-level voltage terminal VGL continuously provides a low-level signal.

In the first stage t1 (that is, an input stage), the input signals of the fifth clock signal terminal CLK5 and the second input terminal INPUT2 are at a high level, and the twenty-first transistor M21 is turned on to pull up the level of the second pull-up node PU2 and charge the fourth capacitor C4, and the thirty-first transistor M31 is turned on.

In this stage, the input signals of the second input terminal INPUT2, the fifth clock signal terminal CLK5, and the third control terminal G3 are at a high level, and the input signals of the fourth control terminal G4, the sixth clock signal terminal CLK6, the third reset terminal RST3, and the detection signal terminal SENSEG are all at a low level. Although the input signal of the third control terminal G3 is at a high level, since the thirty-first transistor M31 is turned on, the level of the second pull-down node PD2 is pulled down, so that the thirty-sixth transistor M36 and the thirty-seventh transistor M37 are not turned on, and the level of the second pull-up node PU2 remains high.

In the second stage t2 (that is, an output stage), the input signal of the fifth clock signal terminal CLK5 is at a low level, the twenty-first transistor M21 is turned off. The signal of the sixth clock signal terminal CLK6 becomes a high level, and the twenty-second transistor M22, the twenty-third transistor M23, and the twenty-fourth transistor M24 are turned on due to the high level of the second pull-up node PU2, so the cascade output terminal CR is pulled high. In the meantime, due to the bootstrap effect of the fourth capacitor C4, the level of the second pull-up node PU2 is further pulled up, so the cascade output terminal CR outputs the signal of the sixth clock signal terminal CLK6 without any loss (in other words, the amplitude of the signal output by the cascade output terminal CR is exactly the same as that of the sixth clock signal terminal CLK6), the third output terminal OUT3 outputs the signal of the sixth clock signal terminal CLK6 without any loss, and the fourth output terminal OUT4 outputs the signal of the sixth clock signal terminal CLK6 without any loss. In addition, the raise of the level of the second pull-up node PU2 improves the conduction capability of the twenty-second transistor M22, the twenty-third transistor M23, and the twenty-fourth transistor M24, and ensures pixel charging.

Since the twenty-first transistor M21 and the twenty-fifth transistor M25 are in a negative bias state for a long time, when the threshold voltages of the twenty-first transistor M21 and the twenty-fifth transistor M25 are negatively drifted and become negative, the twenty-first transistor M21 and the twenty-fifth transistor M25 may be turned on unexpectedly to pull down the level of the second pull-up node PU2, so that the output become abnormal. In this stage, in order to ensure that the second pull-up node PU2 is always at a high level, the level of the low level signal of the fifth clock signal terminal CLK5 is set to be lower than that of the low level signal of the second input terminal INPUT2, and the level of the low level signal of the third reset terminal RST3 is set to be lower than that of the signal of the low-level voltage terminal VGL, so that no leakage will occur in the twenty-first transistor M21 and the twenty-fifth transistor M25 in an off state even if their threshold voltages are negatively shifted.

In this stage, the input signals of the sixth clock signal terminal CLK6 and the third control terminal G3 are at a high level, the input signals of the second input terminal INPUT2, the fourth control terminal G4, the fifth clock signal terminal CLK5, the third reset terminal RST3, and the detection signal terminal SENSEG are all at a low level, and the output signals of the cascade output terminal CR, the third output terminal OUT3, and the fourth output terminal OUT4 are at a high level. Since the level of the second pull-up node PU2 is still high, the thirty-first transistor M31 is still in an on state to pull down the level of the second pull-down node PD2, so that the twenty-sixth transistor M26, the twenty-seventh transistor M27, twenty-eighth transistor M28, the thirty-sixth transistor M36 and thirty-seventh transistor M37 are turned off, and the levels of the second pull-up node PU2, the cascade output terminal CR, the third output terminal OUT3 and the fourth output terminal OUT4 will not be pulled low.

In the third stage t3 (that is, a reset phase), the input signal of the third reset terminal RST3 is at a high level, the twenty-fifth transistor M25 is turned on, and the level of the second pull-up node PU2 is pulled down to the low level of the low-level voltage terminal VGL. Since the level of the second pull-up node PU2 is low, the thirty-first transistor M31 is turned off, the input signal of the third control terminal G3 is at a high level, and the level of the second pull-down node PD2 is at a high level. Therefore, the twenty-sixth transistor M26, the twenty-seventh transistor M27, the twenty-eighth transistor M28, the thirty-sixth transistor M36, and the thirty-seventh transistor M37 are turned on, the signals of the cascade output terminal CR, the third output terminal OUT3, the fourth output terminal OUT4 and the second pull-up node PU2 are at a low level to reduce noise.

In this stage, the input signals of the third reset terminal RST3, the fifth clock signal terminal CLK5, and the third control terminal G3 are at a high level, and the input signals of the second input terminal INPUT2, the fourth control terminal G4, the sixth clock signal terminal CLK6, and the detection signal terminal SENSEG are at a low level.

In the fourth stage t4, the input signal of the sixth clock signal terminal CLK6 is at a high level, and since the level of the second pull-up node PU2 is at a low level, the twenty-second transistor M22, the twenty-third transistor M23, and the twenty-fourth transistor M24 are turned off, and the output signals of the cascade output terminal CR, the third output terminal OUT3, and the fourth output terminal OUT4 are at a low level. In the meantime, the thirty-first transistor M31 is turned off, the level of the second pull-down node PD2 continues to be a high level, and the twenty-sixth transistor M26, the twenty-seventh transistor M27, the twenty-eighth transistor M28, the thirty-sixth transistor M36 and the thirty-seventh transistor M37 are turned on, so that the low level of the low-level voltage terminal VGL is provided to the cascade output terminal CR, the third output terminal OUT3, the fourth output terminal OUT4, and the second pull-up node PU2 to reduce noise.

In this stage, the input signals of the sixth clock signal terminal CLK6 and the third control terminal G3 are at a high level, and the input signals of the second input terminal INPUT2, the third reset terminal RST3, the fourth control terminal G4, the fifth clock signal terminal CLK5, and the detection signal terminal SENSEG are at a low level.

In the fifth stage t5, the input signal of the sixth clock signal terminal CLK6 is at a low level, and since the level of the second pull-up node PU2 is at a low level, the twenty-second transistor M22, the twenty-third transistor M23, and the twenty-fourth transistor M24 are turned off, and the output signals of the cascade output terminal CR, the third output terminal OUT3, and the fourth output terminal OUT4 are at a low level. In the meantime, the thirty-first transistor M31 is turned off, the level of the second pull-down node PD2 continues to be a high level, and the twenty-sixth transistor M26, the twenty-seventh transistor M27, the twenty-eighth transistor M28, the thirty-sixth transistor M36 and the thirty-seventh transistor M37 are turned on, so that the low level of the low-level voltage terminal VGL is provided to the cascade output terminal CR, the third output terminal OUT3, the fourth output terminal OUT4, and the second pull-up node PU2 to reduce noise.

In this stage, the input signals of the fifth clock signal terminal CLK5 and the third control terminal G3 are at a high level, and the input signals of the second input terminal INPUT2, the third reset terminal RST3, the fourth control terminal G4, the sixth clock signal terminal CLK6, and the detection signal terminal SENSEG are at a low level.

After the reset stage t3, the fourth stage t4 and the fifth stage t5 are alternately repeated until the second input terminal INPUT2 of the current stage of shift register receives a high-level signal again.

It should be noted that the detection signal terminal SENSEG of the display sub-shift register is coupled to the detection sub-shift register. Therefore, the input signal of the detection signal terminal SENSEG is at a high level when the first pull-up node PU1 of the detection sub-shift register is at a high level, thereby pulling down the levels of the second pull-up node and the second pull-down node to ensure that the display sub-shift register has no output when the detection sub-shift register has an output.

Figure 11:
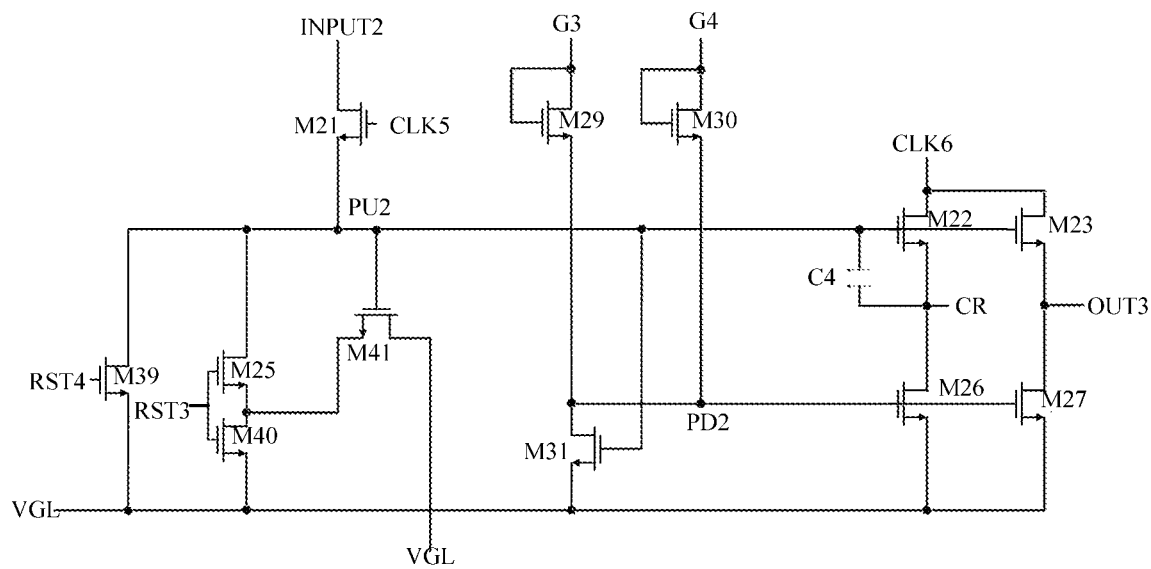
FIG. 11 is another circuit diagram of a display sub-shift register according to an embodiment of the present disclosure.
Figure 12:
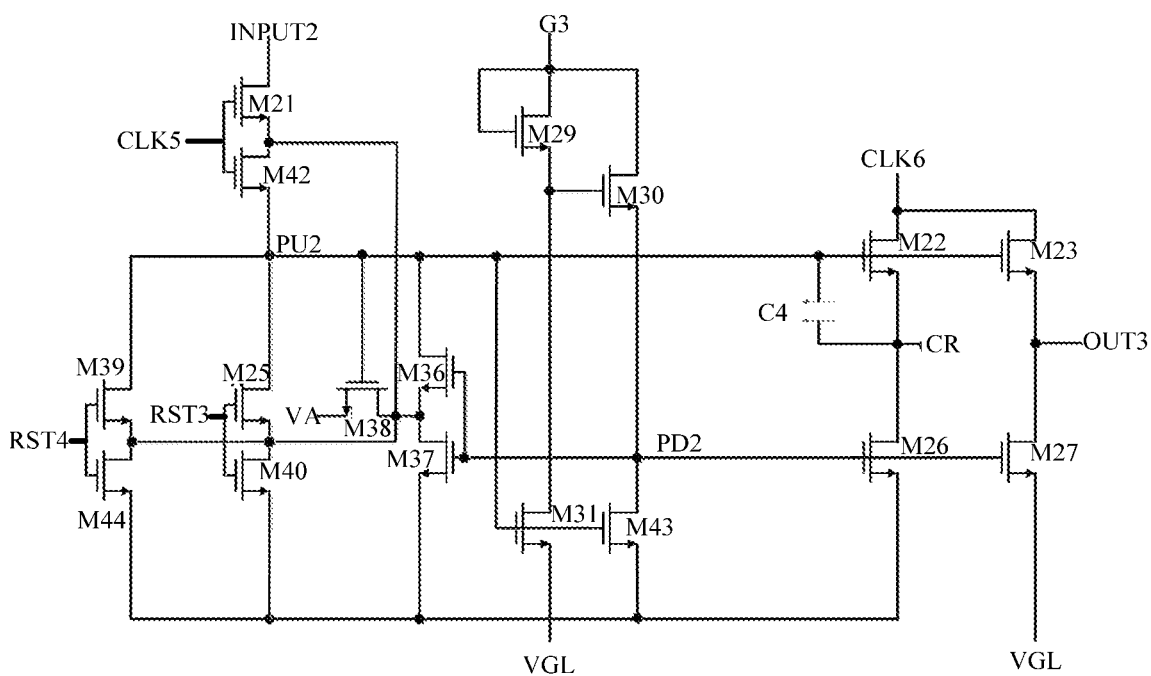
FIG. 12 is still another circuit diagram of a display sub-shift register according to an embodiment of the present disclosure.

FIG. 11 is another circuit diagram of a display sub-shift register according to an embodiment of the present disclosure. FIG. 12 is still another circuit diagram of a display sub-shift register according to an embodiment of the present disclosure. The operation principles of the display sub-shift registers shown in FIGS. 11 and 12 are similar to that of the display sub-shift register shown in FIG. 9 and will not be described herein.

It should be noted that the second control sub-circuit is not shown in the display sub-shift registers in FIGS. 11 and 12.

As compared with the circuit of the display sub-shift register shown in FIG. 9, the circuit of the display sub-shift register shown in FIG. 11 further includes the thirty-ninth transistor M39, the fortieth transistor M40, and the forty-first transistor M41. In addition, the second control sub-circuit and the third leak prevention sub-circuit are not shown in FIG. 11. Since FIG. 11 corresponds to the case of driving one gate line, the display output sub-circuit of the display sub-shift register shown in FIG. 11 includes only the twenty-second transistor M22 and the twenty-third transistor M23, and the display output control sub-circuit includes only the twenty-sixth transistor M26 and the twenty-seventh transistor M27.

The thirty-ninth transistor M39 has a control electrode coupled to the fourth reset terminal RST4, a first electrode coupled to the second pull-up node PU2, and a second electrode coupled to the low-level voltage terminal VGL, and is configured to initialize the signal of the second pull-up node PU2 to the low level of the low-level voltage terminal VGL. The fortieth transistor M40 has a control electrode coupled to the third reset terminal RST3, a first electrode coupled to the second electrode of the twenty-fifth transistor M25, and a second electrode coupled to the low-level voltage terminal VGL, and is configured to pull down the level of the second pull-up node PU2 to reduce noise. The forty-first transistor M41 has a control electrode coupled to the second pull-up node PU2, a first electrode coupled to the second electrode of the twenty-fifth transistor M25, and a second electrode coupled to the low-level voltage terminal VGL, and is configured to prevent the leakage of the twenty-fifth transistor M25 or the fortieth transistor M40 to maintain the high level of the second pull-up node PU2. In FIG. 11, the display reset sub-circuit includes the twenty-fifth transistor M25 and the fortieth transistor M40.

As compared with the circuit of the display sub-shift register shown in FIG. 9, the circuit of the display sub-shift register shown in FIG. 12 further includes the thirty-ninth transistor M39, the fortieth transistor M40, a forty-second transistor M42, a forty-third transistor M43 and a forty-fourth transistor M44. In addition, the second control sub-circuit and the third leak prevention sub-circuit are not shown in FIG. 12. Since FIG. 12 corresponds to the case of driving one gate line, the display output sub-circuit of the display sub-shift register shown in FIG. 12 includes only the twenty-second transistor M22 and the twenty-third transistor M23, and the display output control sub-circuit includes only the twenty-sixth transistor M26 and the twenty-seventh transistor M27.

In an embodiment, the thirty-ninth transistor M39 has a control electrode coupled to the fourth reset terminal RST4, a first electrode coupled to the second pull-up node PU2, and a second electrode coupled to the low-level voltage terminal VGL, and is configured to initialize the signal of the second pull-up node PU2. The fortieth transistor M40 has a control electrode coupled to the third reset terminal RST3, a first electrode coupled to the second electrode of the twenty-fifth transistor M25, and a second electrode coupled to the low-level voltage terminal VGL, and is configured to pull down the level of the second pull-up node PU2 to reduce noise. The forty-second transistor M42 has a control electrode coupled to the fifth clock signal terminal CLK5, a first electrode coupled to the second electrode of the twenty-first transistor M21, and a second electrode coupled to the second pull-up node PU2, and is configured to, in conjunction with the thirty-third transistor M38, prevent the leakage of the twenty-first transistor M21 or the forty-second transistor M42 to maintain the level of the second pull-up node PU2. The forty-third transistor M43 has a control electrode coupled to the second pull-up node PU2, a first electrode coupled to the second pull-down node PD2, and a second electrode coupled to the low-level voltage terminal VGL, and is configured to control the signal of the second pull-down node PD2, in conjunction with the twenty-ninth transistor M29, the thirtieth transistor M30 and the thirty-first transistor M31. The forty-fourth transistor M44 has a control electrode coupled to the fourth reset terminal RST4, a first electrode coupled to the second electrode of the thirty-ninth transistor M39 and the second electrode of the thirty-sixth transistor M36, and a second electrode coupled to the low-level voltage terminal VGL, and is configured to, in conjunction with the thirty-eighth transistor M38, prevent the leakage of the thirty-ninth transistor M39 to maintain the high level of the second pull-up node PU2.

In FIG. 12, the display reset sub-circuit includes the twenty-fifth transistor M25 and the fortieth transistor M40, the display node control sub-circuit includes the twenty-ninth transistor M29, the thirtieth transistor M30, the thirty-first transistor M31, and the forty-three transistors M43, and the display input sub-circuit includes the twenty-first transistor M21 and the forty-second transistor M42. In this case, the third feedback node OFF3 is coupled not only to the second electrode of the thirty-sixth transistor M36 but also to the first electrode of the forty-second transistor M42, the first electrode of the fortieth transistor M40, and the first electrode of the forty-fourth transistor M44.

It should be noted that FIGS. 9, 11 and 12 provided according to the embodiments of the present disclosure are intended to merely provide three examples of specific circuits of the display sub-shift register, and the embodiments of the present disclosure are not limited thereto.

The signal of the fourth reset terminal RST4 in FIGS. 11 and 12 is a signal for controlling initialization. In some embodiments, the signal of the fourth reset terminal RST4 may be implemented to have a narrow pulse before the start of the first stage t1 and at a low level during the first stage t1 to the fifth stage t5.

For the signals of the respective signal terminals of FIG. 11 and FIG. 12 in addition to the signal of the fourth reset terminal RST4, reference may be made to the timing diagram shown in FIG. 10, and details are not described herein again.

Figure 13:
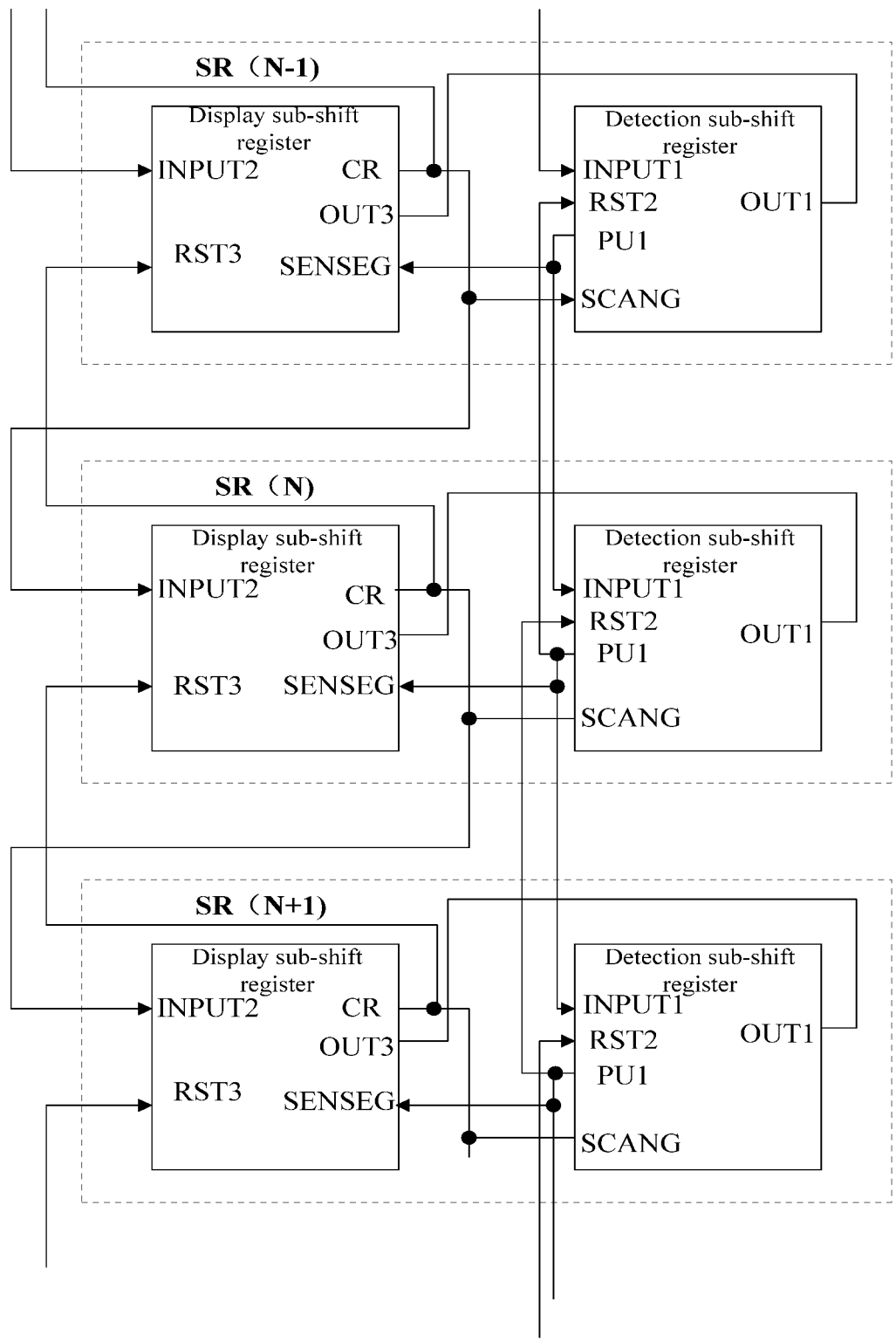
FIG. 13 is a structural schematic diagram of a gate driving circuit according to an embodiment of the present disclosure.
Figure 14:
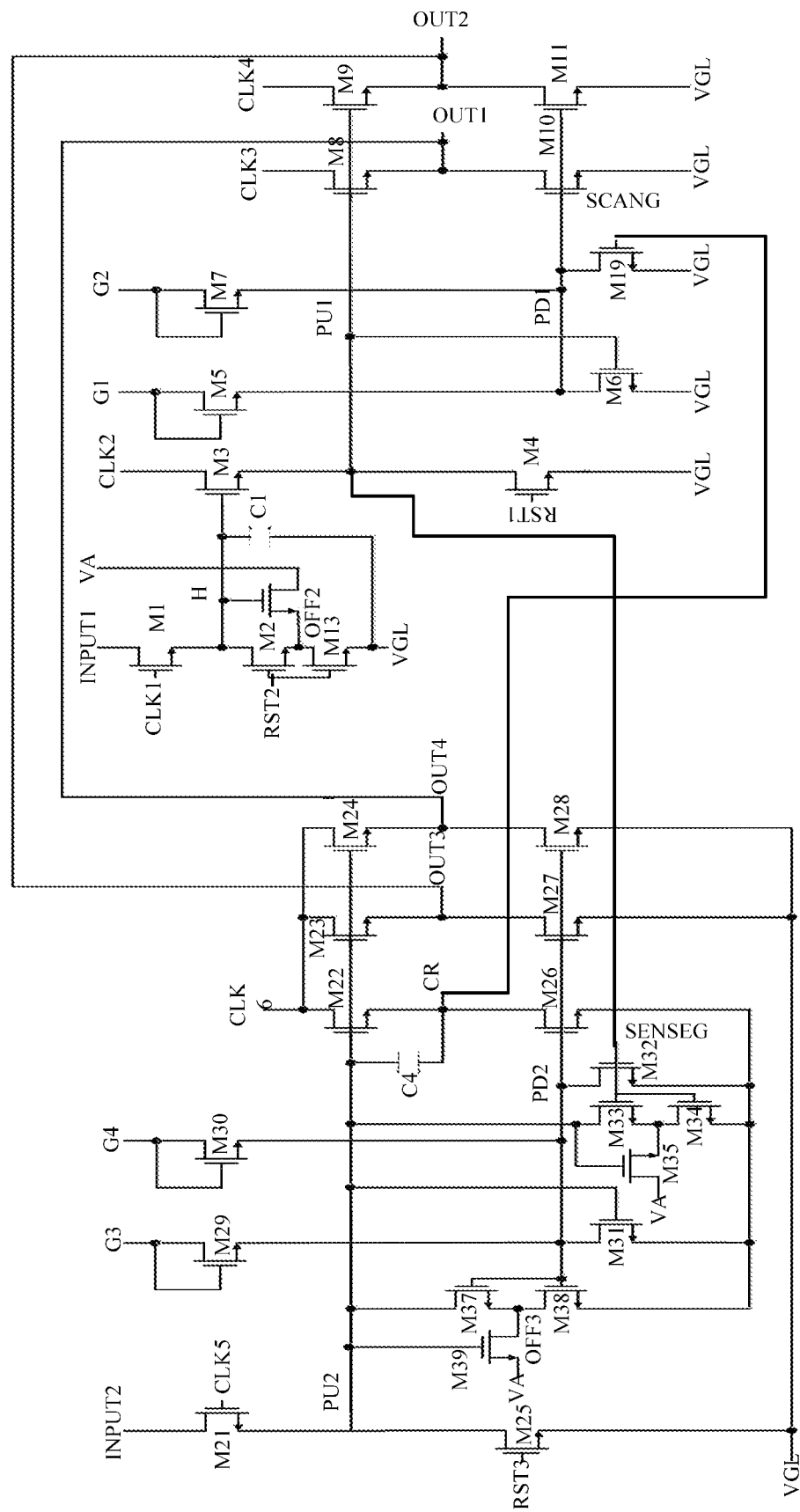
FIG. 14 is a circuit diagram of each stage of shift register according to an embodiment of the present disclosure.

Based on the inventive concepts of the foregoing embodiments, the embodiments of the present disclosure further provide a gate driving circuit. FIG. 13 is a structural schematic diagram of a gate driving circuit according to an embodiment of the present disclosure, and FIG. 14 is a circuit diagram of each stage of shift register according to an embodiment of the present disclosure. As shown in FIGS. 13 and 14, the gate driving circuit according to an embodiment of the present disclosure includes a plurality of cascaded shift registers, for example, an (N−1)th stage of shift register SR(N−1), an Nth stage of shift register SR(N), and an (N+1)th stage of shift register SR(N+1). Each stage of shift register includes a display sub-shift register and a detection sub-shift register. The detection sub-shift register includes the first input terminal INPUT1, the first output terminal OUT1, the second reset terminal RST2, the first pull-up node PU1 and the display control terminal SCANG. The display sub-shift register includes the cascade output terminal CR, the second input terminal INPUT2, the third output terminal OUT3, the third reset terminal RST3, and the detection control terminal SENSEG.

In an embodiment, the first input terminal INPUT1 of the detection sub-shift register of the first stage of shift register is coupled to a first initial signal terminal (not shown in the drawings), the first input terminal INPUT1 of the detection sub-shift register of the Nth (N≥2) stage of shift register is coupled to the first pull-up node PU1 of the detection sub-shift register of the (N−1)th stage of shift register, and the second reset terminal RST2 of the detection sub-shift register of the Nth stage of shift register is coupled to the first pull-up node PU1 of the detection sub-shift register of the (N+1)th stage of shift register. The second input terminal INPUT2 of the display sub-shift register of the first stage of shift register is coupled to a second initial signal terminal, the second input terminal INPUT2 of the display sub-shift register of the Nth stage of shift register is coupled to the cascade output terminal CR of the display sub-shift register of the (N−1)th stage of shift register, and the third reset terminal RST3 of the display sub-shift register of the Nth stage of shift register is coupled to the cascade output terminal CR of the display sub-shift register of the (N+1)th stage of shift register. The detection control terminal SENSEG of the display sub-shift register of the Nth stage of shift register is coupled to the first pull-up node PU1 of the detection sub-shift register of the Nth stage of shift register. The cascade output terminal CR of the display sub-shift register of the Nth stage of shift register is coupled to the display control terminal SCANG of the detection sub-shift register of the Nth stage of shift register, and the third output terminal OUT3 of the display sub-shift register of the Nth stage of shift register is coupled to the first output terminal OUT1 of the detection sub-shift register of the Nth stage of shift register.

It should be noted that, FIG. 14 shows an example in which the display sub-shift register includes two output terminals (the third output terminal OUT3 and the fourth output terminal OUT4) for driving two gate lines, and the detection sub-shift register includes two output terminals (the first output terminal OUT1 and the second output terminal OUT2). In this case, when the output of the display sub-shift register is coupled to the output of the detection sub-shift register, the first output terminal OUT1 may be coupled to the third output terminal OUT3, and alternatively, may be coupled to the fourth output terminal OUT4. FIG. 14 illustrates an example in which the first output terminal OUT1 is coupled to the fourth output terminal OUT4 and the second output terminal OUT2 is coupled to the third output terminal OUT3, but the present disclosure is not limited thereto.

In the present embodiment, the output of the display sub-shift register may be coupled to the output of the detection sub-shift register, or may be provided separately from the output of the detection sub-shift register. FIG. 14 shows the case where the output of the display sub-shift register may be coupled to the output of the detection sub-shift register. As shown in FIG. 14, the nineteenth transistor M19 is controlled by the cascade output terminal CR, so that when the display sub-shift register operates, the first pull-down node PD1 is pulled low, and the first pull-up node PU1 is pulled low by the first pull-down node PD1, and thus the output of the shift register is determined by the output of the display sub-shift register that is operating. In the meantime, the thirty-second transistor M32, the thirty-third transistor M33, and the thirty-fourth transistor M34 are controlled by the first pull-up node PU1, so that when the display sub-shift register does not operate and the detection sub-shift register operates, the second pull-up node PU2 and the second pull-down node PD2 are pulled low, and thus the output of the shift register is determined by the output of the detection sub-shift register that is operating.

It should be noted that the circuit of the detection sub-shift register in the shift register may be any one of the circuits shown in FIGS. 5A to 5H, and may also be another circuit capable of implementing the function of the detection sub-shift register according to an embodiment of the present disclosure, the circuit of the display sub-shift register in the shift register may be any one of the circuits shown in FIGS. 8, 11 and 12, and may also be another circuit capable of implementing the function of the display sub-shift register according to an embodiment of the present disclosure, and the embodiments of the present disclosure are not limited thereto. FIG. 14 illustrates an example in which the circuit of the display sub-shift register is the one shown in FIG. 8 and the circuit of the detection sub-shift register is the one shown in FIG. 5C.

Since the above gate driving circuit employs the shift register (which includes at least the detection sub-shift register according to an embodiment of the present disclosure) according to an embodiment of the present disclosure, the input of the detection sub-shift register of the current stage of shift register is coupled to the first pull-up node of the detection sub-shift register of the previous stage of shift register and independent of the load of the detection sub-shift register of the previous stage of shift register, thereby ensuring the cascading capability of the GOA circuit and improving the stability of display and display effect.

Figure 15:
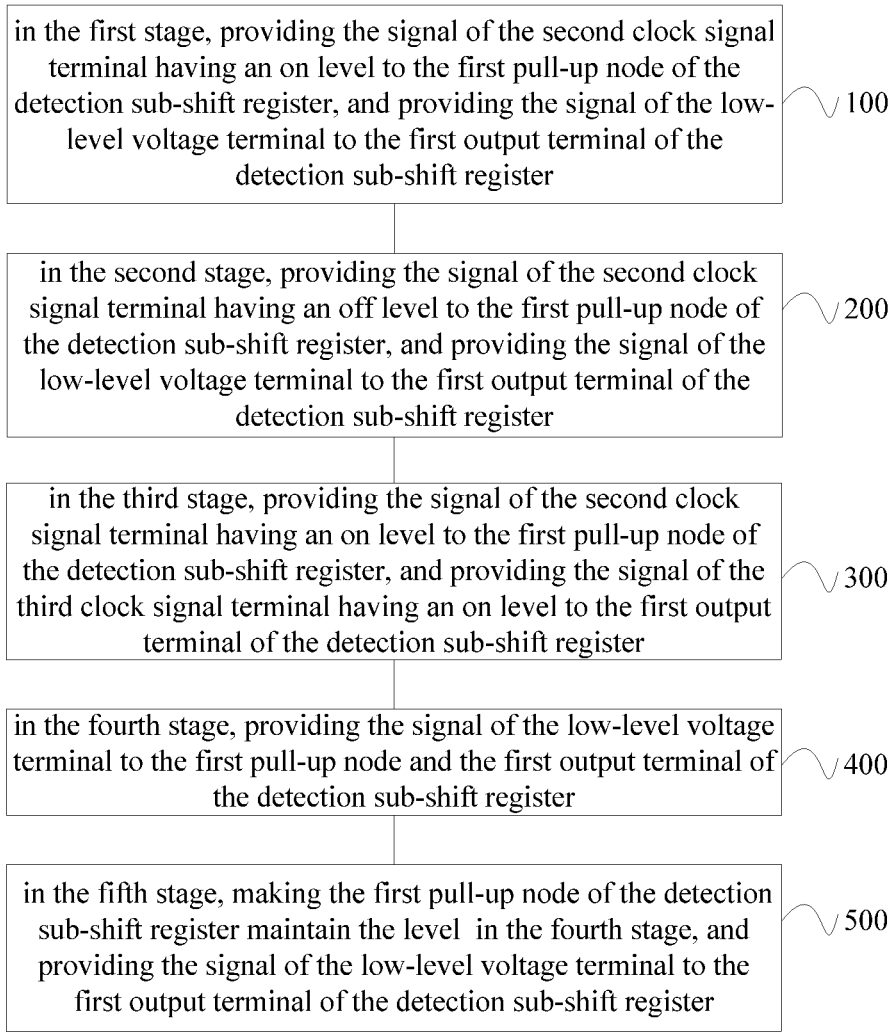
FIG. 15 is a flowchart of a method of driving a shift register according to an embodiment of the present disclosure.

Based on the inventive concept of the foregoing embodiments, the embodiments of the present disclosure further provide a method of driving a shift register. FIG. 15 is a flowchart of a method of driving a shift register according to an embodiment of the present disclosure, which is applied to the above shift register. As shown in FIG. 15, the method of driving the shift register according to an embodiment of the present disclosure includes steps 100 to 500.

In step 100, in the first stage, the signal of the second clock signal terminal having an on level is provided to the first pull-up node of the detection sub-shift register, and the signal of the low-level voltage terminal is provided to the first output terminal of the detection sub-shift register.

In step 200, in the second stage, the signal of the second clock signal terminal having an off level is provided to the first pull-up node of the detection sub-shift register, and the signal of the low-level voltage terminal is provided to the first output terminal of the detection sub-shift register.

In step 300, in the third stage, the signal of the second clock signal terminal having an on level is provided to the first pull-up node of the detection sub-shift register, and the signal of the third clock signal terminal having an on level is provided to the first output terminal of the detection sub-shift register.

In step 400, in the fourth stage, the signal of the low-level voltage terminal is provided to the first pull-up node and the first output terminal of the detection sub-shift register.

In step 500, in the fifth stage, the level of the first pull-up node of the detection sub-shift register in the fourth stage is maintained, and the signal of the low-level voltage terminal is provided to the first output terminal of the detection sub-shift register.

In the above steps, a time period in which the signal of the first pull-up node is at the on level at least partially overlaps with a time period in which the signal of the first output terminal is at the on level, and when the signal of the first pull-up node is at the off level, the signal of the first output terminal is at the off level.

In the embodiments of the present disclosure, by providing the signal of the first pull-up node of the detection sub-shift register of the previous stage of shift register to the first input terminal of the detection sub-shift register of the current stage of shift register, the signal of the first input terminal is not affected by the load of the detection sub-shift register of the previous stage of shift register, not only improving the cascading capability of the entire GOA circuit, but also ensuring the stability of display and display effect.

The drawings of the present disclosure relate only to the structures involved in the embodiments of the present disclosure, and other structures may refer to the general design.

The embodiments of the present disclosure, that is, the features in the embodiments, may be combined with each other without conflict to obtain a new embodiment.

While the embodiments of the present disclosure are described above, the description is only for the purpose of understanding the present disclosure, and is not intended to limit the present disclosure.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation. The protection scope of the present disclosure should be defined by the following claims.

What is claimed is:

1. A shift register, comprising:
a display sub-shift register; and
a detection sub-shift register coupled to the display sub-shift register, the detection sub-shift register comprising:
a first input terminal, a first output terminal, a first reset terminal, and a second reset terminal;

a detection input sub-circuit coupled to a first clock signal terminal, a second clock signal terminal, the first input terminal, a pull-up control node and a first pull-up node of the detection sub-shift register, and configured to provide a signal of the first input terminal to the pull-up control node under control of the first clock signal terminal, and provide a signal of the second clock signal terminal to the first pull-up node under control of the pull-up control node;

a detection output sub-circuit coupled to the first pull-up node, a third clock signal terminal and the first output terminal, and configured to provide a signal of the third clock signal terminal to the first output terminal under control of the first pull-up node;

a detection output control sub-circuit coupled to the first output terminal, a first pull-down node and a low-level voltage terminal, and configured to provide a signal of the low-level voltage terminal having a constant low level to the first output terminal under control of the first pull-down node;

a detection reset sub-circuit coupled to the first reset terminal, the second reset terminal, the first pull-up node, the pull-up control node and the low-level voltage terminal, and configured to provide the signal of the low-level voltage terminal to the first pull-up node under control of the first reset terminal, and provide the signal of the low-level voltage terminal to the pull-up control node under control of the second reset terminal; and a detection node control sub-circuit coupled to a first control terminal, a second control terminal, the first pull-up node, the first pull-down node, and the low-level voltage terminal, and configured to provide the signal of the low-level voltage terminal to the first pull-down node under control of the first control terminal, the second control terminal, and the first pull-up node.

2. The shift register of claim 1, wherein a time period in which a signal of the first pull-up node is at an on level at least partially overlaps with a time period in which a signal of the first output terminal is at an on level, and when the signal of the first pull-up node is at an off level, the signal of the first output terminal is at an off level.

3. The shift register of claim 1, wherein the detection sub-shift register further comprises:
a first control sub-circuit coupled to a display control terminal, the first pull-down node, and the low-level voltage terminal, and configured to provide the signal of the low-level voltage terminal to the first pull-down node under control of the display control terminal.

4. The shift register of claim 1, wherein a voltage level of an off signal provided to the first reset terminal, the second reset terminal, and the first clock signal terminal is lower than a voltage level of the signal of the low-level voltage terminal.

5. The shift register of claim 1, wherein the detection output sub-circuit is further coupled to a fourth clock signal terminal and a second output terminal, and is configured to provide a signal of the fourth clock signal terminal to the second output terminal under control of the first pull-up node, and
the detection output control sub-circuit is further coupled to the second output terminal, and is configured to provide the signal of the low-level voltage terminal to the second output terminal under control of the first pull-down node.

6. The shift register of claim 1, wherein the detection input sub-circuit comprises: a first transistor and a third transistor, and wherein
the first transistor has a control electrode coupled to the first clock signal terminal, a first electrode coupled to the first input terminal, and a second electrode coupled to the pull-up control node, and
the third transistor has a control electrode coupled to the pull-up control node, a first electrode coupled to the second clock signal terminal, and a second electrode coupled to the first pull-up node.

7. The shift register of claim 1, wherein the detection input sub-circuit comprises: a first transistor, a third transistor, and a twelfth transistor, and wherein
the first transistor has a control electrode coupled to the first clock signal terminal, a first electrode coupled to the first input terminal, and a second electrode coupled to a first electrode of the twelfth transistor,
the twelfth transistor has a control electrode coupled to the first clock signal terminal, and a second electrode coupled to the pull-up control node, and
the third transistor has a control electrode coupled to the pull-up control node, a first electrode coupled to the second clock signal terminal, and a second electrode coupled to the first pull-up node.

8. The shift register of claim 6, wherein the detection reset sub-circuit comprises a first reset sub-circuit and a second reset sub-circuit,
the first reset sub-circuit is coupled to the first pull-up node, the low-level voltage terminal, and the first reset terminal, and configured to provide the signal of the low-level voltage terminal to the first pull-up node under control of the first reset terminal, and
the second reset sub-circuit is coupled to the second reset terminal, the pull-up control node and the low-level voltage terminal, and configured to provide the signal of the low-level voltage terminal to the pull-up control node under control of the second reset terminal.

9. The shift register of claim 8, wherein the first reset sub-circuit comprises a fourth transistor, and
the fourth transistor has a control electrode coupled to the first reset terminal, a first electrode coupled to the first pull-up node, and a second electrode coupled to the low-level voltage terminal.

10. The shift register of claim 8, wherein the first reset sub-circuit comprises: a fourth transistor and a fifteenth transistor,
the fourth transistor has a control electrode coupled to the first reset terminal, a first electrode coupled to the first pull-up node, and a second electrode coupled to a first feedback node, and
the fifteenth transistor has a control electrode coupled to the first reset terminal, a first electrode coupled to the first feedback node, and a second electrode coupled to the low-level voltage terminal,
the detection sub-shift register further comprises a first leakage prevention sub-circuit,
the first leakage prevention sub-circuit is coupled to the first pull-up node, the first pull-down node, the first feedback node, a high-level voltage terminal, and the low-level voltage terminal, and configured to, under control of the first pull-down node and the first pull-up node, provide the signal of the low-level voltage terminal to the first feedback node in response to the first pull-down node being at an on level, and provide a signal of the high-level voltage terminal to the first feedback node in response to the first pull-up node being at an on level and the first pull-down node being at an off level, to maintain the on level of the first pull-up node, and the first leakage prevention sub-circuit comprises a sixteenth transistor, a seventeenth transistor, and an eighteenth transistor, the sixteenth transistor has a control electrode coupled to the first pull-down node, a first electrode coupled to the first pull-up node, and a second electrode coupled to a first electrode of the seventeenth transistor, the seventeenth transistor has a control electrode coupled to the first pull-down node, and a second electrode coupled to the low-level voltage terminal, the eighteenth transistor has a control electrode coupled to the first pull-up node, a first electrode coupled to the second electrode of the sixteenth transistor, and a second electrode coupled to the high-level voltage terminal, and the first feedback node is coupled to the first electrode of the eighteenth transistor.

11. The shift register of claim 8, wherein the second reset sub-circuit comprises a second transistor, and the second transistor has a control electrode coupled to the second reset terminal, a first electrode coupled to the pull-up control node, and a second electrode coupled to the low-level voltage terminal.

12. The shift register of claim 8, wherein the second reset sub-circuit comprises a second transistor and a thirteenth transistor, the second transistor has a control electrode coupled to the second reset terminal, a first electrode coupled to the pull-up control node, and a second electrode coupled to a second feedback node, and the thirteenth transistor has a control electrode coupled to the second reset terminal, a first electrode coupled to the second feedback node, and a second electrode coupled to the low-level voltage terminal, the detection sub-shift register further comprises a second leakage prevention electronic circuit, the second leakage prevention sub-circuit is coupled to the pull-up control node, a high-level voltage terminal and the second feedback node, and configured to provide the signal of the high-level voltage terminal to the second feedback node under control of the pull-up control node, to maintain the on level of the pull-up control node, and the second leakage prevention sub-circuit comprises a fourteenth transistor, the fourteenth transistor has a control electrode coupled to the pull-up control node, a first electrode coupled to the high-level voltage terminal, and a second electrode coupled to the second feedback node.

13. The shift register of claim 7, wherein the detection reset sub-circuit comprises a first reset sub-circuit and a second reset sub-circuit, the first reset sub-circuit is coupled to the first pull-up node, the low-level voltage terminal, and the first reset terminal, and configured to provide the signal of the low-level voltage terminal to the first pull-up node under control of the first reset terminal, the second reset sub-circuit is coupled to the second reset terminal, the pull-up control node and the low-level voltage terminal, and configured to provide the signal of the low-level voltage terminal to the pull-up control node under control of the second reset terminal, the second reset sub-circuit comprises a second transistor and a thirteenth transistor, the second transistor has a control electrode coupled to the second reset terminal, a first electrode coupled to the pull-up control node, and a second electrode coupled to a second feedback node, the thirteenth transistor has a control electrode coupled to the second reset terminal, a first electrode coupled to the second feedback node, and a second electrode coupled to the low-level voltage terminal, the detection sub-shift register further comprises a second leakage prevention electronic circuit, and the second leakage prevention sub-circuit is coupled to the pull-up control node, a high-level voltage terminal and the second feedback node, and configured to provide the signal of the high-level voltage terminal to the second feedback node under control of the pull-up control node, to maintain the on level of the pull-up control node.

14. The shift register of claim 13, wherein the second leakage prevention sub-circuit comprises a fourteenth transistor, the fourteenth transistor has a control electrode coupled to the pull-up control node, a first electrode coupled to the high-level voltage terminal, and a second electrode coupled to the second feedback node, and the second feedback node is coupled to the second electrode of the first transistor.

15. The shift register of claim 5, wherein the detection output sub-circuit comprises an eighth transistor and a ninth transistor, the eighth transistor has a control electrode coupled to the first pull-up node, a first electrode coupled to the third clock signal terminal, and a second electrode coupled to the first output terminal, the ninth transistor has a control electrode coupled to the first pull-up node, a first electrode coupled to the fourth clock signal terminal, and a second electrode coupled to the second output terminal, the detection output control sub-circuit comprises a tenth transistor and an eleventh transistor, the tenth transistor has a control electrode coupled to the first pull-down node, a first electrode coupled to the first output terminal, and a second electrode coupled to the low-level voltage terminal, and the eleventh transistor has a control electrode coupled to the first pull-down node, a first electrode coupled to the second output terminal, and a second electrode coupled to the low-level voltage terminal, and wherein the detection output sub-circuit further comprises a second capacitor and a third capacitor, the second capacitor has a first end coupled to the first pull-up node, and a second end coupled to the first output terminal, and the third capacitor has a first end coupled to the first pull-up node, and a second end coupled to the second output terminal.

16. The shift register of claim 3, wherein the display sub-shift register comprises:

a display input sub-circuit coupled to a second input terminal, a fifth clock signal terminal, and a second pull-up node, and configured to provide a signal of the second input terminal to the second pull-up node under control of the fifth clock signal terminal;

a display output sub-circuit coupled to a sixth clock signal terminal, the second pull-up node, a cascade output terminal, and a third output terminal, and configured to provide a signal of the sixth clock signal terminal to the cascade output terminal and the third output terminal under control of the second pull-up node;

a display reset sub-circuit coupled to a third reset terminal, the second pull-up node and the low-level voltage terminal, and configured to provide the signal of the low-level voltage terminal to the second pull-up node under control of the third reset terminal;

a display output control sub-circuit coupled to the cascade output terminal, the third output terminal, a second pull-down node, and the low-level voltage terminal, and configured to provide the signal of the low-level voltage terminal to the cascade output terminal and the third output terminal under control of the second pull-down node;

a display node control sub-circuit coupled to a third control terminal, a fourth control terminal, the second pull-up node, the second pull-down node, and the low-level voltage terminal, and configured to provide the signal of the low-level voltage terminal to the second pull-down node under control of the third control terminal, the fourth control terminal, and the second pull-up node, and the display control terminal is coupled to the cascade output terminal such that the detection sub-shift register does not operate when the display sub-shift register operates.

17. The shift register of claim 15, wherein the display sub-shift register further comprises:

a second control sub-circuit coupled to the second pull-up node, a second pull-down node, a detection control terminal, a high-level voltage terminal, and the low-level voltage terminal, and configured to provide the signal of the low-level voltage terminal to the second pull-up node and the second pull-down node under control of the detection control terminal, and the detection control terminal is coupled to the first pull-up node.

18. A gate driving circuit, comprising a plurality of shift registers cascaded in first to (N+1)-th stages, each of the shift registers being the shift register of claim 1, and comprising a display sub-shift register and a detection sub-shift register, wherein the display sub-shift register comprises a cascade output terminal, a second input terminal, a third output terminal, a third reset terminal, and a detection control terminal, the first input terminal of the detection sub-shift register of the first stage of shift register is coupled to a first initial signal terminal, the first input terminal of the detection sub-shift register of the N-th stage of shift register is coupled to the first pull-up node of the detection sub-shift register of the (N−1)-th stage of shift register, and the second reset terminal of the detection sub-shift register of the N-th stage of shift register is coupled to the first pull-up node of the detection sub-shift register of the (N+1)-th stage of shift register, the second input terminal of the display sub-shift register of the first stage of shift register is coupled to a second initial signal terminal, the second input terminal of the display sub-shift register of the N-th stage of shift register is coupled to the cascade output terminal of the display sub-shift register of the (N−1)-th stage of shift register, and the third reset terminal of the display sub-shift register of the N-th stage of shift register is coupled to the cascade output terminal of the display sub-shift register of the (N+1)-th stage of shift register, the detection control terminal of the display sub-shift register of the N-th stage of shift register is coupled to the first pull-up node of the detection sub-shift register of the N-th stage of shift register, the cascade output terminal of the display sub-shift register of the N-th stage of shift register is coupled to a display control terminal of the detection sub-shift register of the N-th stage of shift register, and the third output terminal of the display sub-shift register of the N-th stage of shift register is coupled to the first output terminal of the detection sub-shift register of the N-th stage of shift register, and N is an integer greater than or equal to two.

19. A display device, comprising the gate driving circuit of claim 18.

20. A method of driving a shift register, the shift register comprising a display sub-shift register and a detection sub-shift register coupled to the display sub-shift register, the method comprising:

in a first stage, providing a signal of a second clock signal terminal having an on level to a first pull-up node of the detection sub-shift register, and providing a signal of a low-level voltage terminal to a first output terminal of the detection sub-shift register;

in a second stage, providing a signal of the second clock signal terminal having an off level to the first pull-up node of the detection sub-shift register, and providing the signal of the low-level voltage terminal to the first output terminal of the detection sub-shift register;

in a third stage, providing a signal of the second clock signal terminal having an on level to the first pull-up node of the detection sub-shift register, and providing a signal of a third clock signal terminal having an on level to the first output terminal of the detection sub-shift register;

in a fourth stage, providing the signal of the low-level voltage terminal to the first pull-up node and the first output terminal of the detection sub-shift register; and in a fifth stage, making the first pull-up node of the detection sub-shift register remain a level in the fourth stage, and providing the signal of the low-level voltage terminal to the first output terminal of the detection sub-shift register, wherein a time period in which the signal of the first pull-up node is at the on level at least partially overlaps with a time period in which the signal of the first output terminal is at the on level, and when the signal of the first pull-up node is at the off level, the signal of the first output terminal is at the off level.

* * * * *